(12) United States Patent
Seo et al.

(10) Patent No.: US 9,401,385 B2
(45) Date of Patent: Jul. 26, 2016

(54) SEMICONDUCTOR MEMORY DEVICE

(71) Applicants: Boyoung Seo, Suwon-si (KR); Yongkyu Lee, Gwacheon-si (KR); Keemoon Chun, Seongnam-si (KR)

(72) Inventors: Boyoung Seo, Suwon-si (KR); Yongkyu Lee, Gwacheon-si (KR); Keemoon Chun, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/639,183

(22) Filed: Mar. 5, 2015

(65) Prior Publication Data

US 2015/0357376 A1    Dec. 10, 2015

(30) Foreign Application Priority Data

Jun. 9, 2014    (KR) .................. 10-2014-0069369

(51) Int. Cl.
| | | |
|---|---|---|
| H01L 29/66 | (2006.01) |
| H01L 29/82 | (2006.01) |
| H01L 27/22 | (2006.01) |
| H01L 43/02 | (2006.01) |
| H01L 43/08 | (2006.01) |
| G11C 11/16 | (2006.01) |

(52) U.S. Cl.
CPC ............ *H01L 27/228* (2013.01); *G11C 11/161* (2013.01); *G11C 11/1675* (2013.01); *H01L 43/02* (2013.01); *H01L 43/08* (2013.01)

(58) Field of Classification Search
CPC ....... H01L 27/228; H01L 43/08; H01L 43/02; G11C 11/1675; G11C 11/161
See application file for complete search history.

(56) References Cited

U.S. PATENT DOCUMENTS

| | | | |
|---|---|---|---|
| 6,924,520 B2 | 8/2005 | Park et al. | |
| 6,924,529 B2 | 8/2005 | Kim et al. | |
| 7,764,539 B2 | 7/2010 | Guo et al. | |
| 7,995,378 B2 | 8/2011 | Yoon et al. | |
| 8,416,600 B2* | 4/2013 | Lin ........................ | G11C 11/16 365/148 |
| 8,547,736 B2 | 10/2013 | Rao et al. | |
| 2003/0198080 A1* | 10/2003 | Iwata ...................... | G11C 11/15 365/158 |
| 2004/0125648 A1* | 7/2004 | Iwata ...................... | G11C 11/15 365/158 |
| 2010/0302838 A1 | 12/2010 | Wang et al. | |
| 2011/0222334 A1 | 9/2011 | Aoki | |
| 2011/0249490 A1 | 10/2011 | Zhu et al. | |
| 2014/0071741 A1* | 3/2014 | Kim ........................ | G11C 11/16 365/158 |
| 2014/0233305 A1* | 8/2014 | Kim .................... | G11C 11/1673 365/158 |
| 2014/0353662 A1* | 12/2014 | Shukh .................. | H01L 27/2436 257/43 |

FOREIGN PATENT DOCUMENTS

| | | |
|---|---|---|
| JP | 2004220759 A | 8/2004 |
| JP | 2005340468 A | 12/2005 |
| JP | 2009151885 A | 7/2009 |
| JP | 2013537679 A | 10/2013 |
| KR | 20040066420 A | 7/2004 |
| KR | 20100097743 A | 9/2010 |
| KR | 20120058425 A | 6/2012 |

* cited by examiner

*Primary Examiner* — Jarrett Stark

(74) *Attorney, Agent, or Firm* — Myers Bigel & Sibley, P.A.

(57) ABSTRACT

The inventive concepts provide a semiconductor memory device including variable resistance memory elements. The semiconductor memory device may include a first bit line disposed at a first height from a semiconductor substrate, a second bit line disposed at a second height, which is different from the first height, from the semiconductor substrate, a first variable resistance memory element connected to the first bit line, and a second variable resistance memory element connected to the second bit line. The first and second variable resistance memory elements may be disposed at substantially the same height from the semiconductor substrate.

19 Claims, 31 Drawing Sheets

|  | WL | | BL1 | | BL2 | | BL3 | |
|---|---|---|---|---|---|---|---|---|
|  | SEL | UNSEL | SEL | UNSEL | SEL | UNSEL | SEL | UNSEL |
| Data'1' | Von | Voff | $V_{BL1}$ | $V_{S1}$ | $V_{BL1}$ | $V_{S1}$ | $V_{S1}$ | $V_{S1}$ |
| Data'0' | Von | Voff | $V_{BL2}$ | $V_{S1}$ | $V_{BL2}$ | $V_{S1}$ | $V_{S2}$ | $V_{S1}$ |
| Read | Von | Voff | $V_{READ}$ | $V_{S1}$ | $V_{READ}$ | $V_{S1}$ | $V_{S1}$ | $V_{S1}$ |

SEMICONDUCTOR MEMORY DEVICE

CROSS-REFERENCE TO RELATED APPLICATION

This U.S. non-provisional patent application claims priority under 35 U.S.C. §119 to Korean Patent Application No. 10-2014-0069369, filed on Jun. 9, 2014, in the Korean Intellectual Property Office, the disclosure of which is hereby incorporated by reference in its entirety.

BACKGROUND

The inventive concepts relate to semiconductor memory devices and, more particularly, to semiconductor memory devices including variable resistance memory elements.

Semiconductor devices are widely used in an electronic industry because of their small sizes, multi-functions, and/or low manufacture costs. Semiconductor devices may include semiconductor memory devices storing logical data, semiconductor logic devices processing logical data, and system-on-chips (SoCs) of which each includes a memory part and a logic part.

Semiconductor devices have been highly integrated with the development of the electronic industry, thereby causing various problems. For example, a margin of a manufacturing process may be reduced, and a resistance of a memory cell of a semiconductor memory device may be increased. Thus, various researches are being conducted to resolve these problems.

SUMMARY

Embodiments of the inventive concepts may provide semiconductor memory devices capable of improving integration density and reliability. In some embodiments, a semiconductor memory device may include: a first bit line disposed at a first height from a semiconductor substrate; a second bit line disposed at a second height from the semiconductor substrate, the second height different from the first height; a first variable resistance memory element connected to the first bit line; and a second variable resistance memory element connected to the second bit line. The first and second variable resistance memory elements may be disposed at the substantially same height from the semiconductor substrate.

In some embodiments, the first and second variable resistance memory elements may be disposed at a height between the first height of the first bit line and the second height of the second bit line in a vertical view.

In some embodiments, the first and second bit lines may be in parallel along a first direction when viewed from a plan view.

In some embodiments, the first variable resistance memory element may be disposed at a position that is shifted from the second variable resistance memory element in a diagonal direction with respect to the first direction.

In some embodiments, each of the first and second variable resistance memory elements may include: a pinned magnetic layer; a free magnetic layer; and a tunnel barrier layer disposed between the pinned and free magnetic layers. The free magnetic layer of the first variable resistance memory element may be adjacent the first bit line, and the pinned magnetic layer of the second variable resistance memory element may be adjacent the second bit line.

In some embodiments, the semiconductor memory device may further include: a selection transistor connected in common to the first and second variable resistance memory elements.

In some embodiments, the semiconductor memory device may further include: a device isolation layer defining an active portion in the semiconductor substrate; a word line intersecting the active portion; first and second dopant regions formed in the active portion at both sides of the word line; a source line connected to the first dopant region; and a conductive pattern disposed at the substantially same height as the second bit line and electrically connected to the second dopant region. The conductive pattern may be electrically connected in common to the first and second variable resistance memory elements.

In some embodiments, the semiconductor memory device may further include: an interconnection pattern disposed at the substantially same height as the first bit line. The interconnection pattern may electrically connect the conductive pattern to the second variable resistance memory element.

In some embodiments, each of the first and second variable resistance memory elements may include: a pinned magnetic layer; a free magnetic layer; and a tunnel barrier layer disposed between the pinned and free magnetic layers. The pinned magnetic layer of the first variable resistance memory element may be disposed on a top surface of the conductive pattern, and the pinned magnetic layer of the second variable resistance memory element may be disposed on a top surface of the second bit line.

In some embodiments, the semiconductor memory device may further include: a source line; a first selection transistor connected between the source line and the first variable resistance memory element; and a second selection transistor connected between the source line and the second variable resistance memory element.

In some embodiments, the semiconductor memory device may further include: a device isolation layer defining first and second active portions in the semiconductor substrate; a word line intersecting the first and second active portions; first and second dopant regions formed in each of the first and second active portions at both sides of the word line; a source line connected in common to the first dopant regions of the first and second active portions; a conductive pattern disposed at the substantially same height as the second bit line and electrically connected to the second dopant region of the first active portion; and an interconnection pattern disposed at the substantially same height as the first bit line, the interconnection pattern electrically connecting the conductive pattern to the second variable resistance memory element.

In some embodiments, the second variable resistance memory element may include: a pinned magnetic layer; a free magnetic layer; and a tunnel barrier layer disposed between the pinned and free magnetic layers, and the pinned magnetic layer of the second variable resistance memory element may be disposed on a top surface of the second bit line.

In some embodiments, the first variable resistance memory element may be electrically connected to the second dopant region of the second active portion.

In some embodiments, the first variable resistance memory element may include: a pinned magnetic layer; a free magnetic layer; and a tunnel barrier layer disposed between the pinned and free magnetic layers, and the free magnetic layer of the first variable resistance memory element may be adjacent a bottom surface of the first bit line.

In another aspect, a semiconductor memory device may include: first and second bit lines extending in parallel to each other, the first and second bit lines disposed at the substantially same height from a top surface of a semiconductor substrate; a first variable resistance memory element connected to the first bit line; and a second variable resistance memory element connected to the second bit line. The first variable resistance memory element and the second variable resistance memory element may be disposed at different heights from the top surface of the semiconductor substrate.

In some embodiments, the first variable resistance memory element may include a pinned magnetic layer, a tunnel barrier layer, and a free magnetic layer which are sequentially stacked, and the second variable resistance memory element may include a free magnetic layer, a tunnel barrier layer, and a pinned magnetic layer which are sequentially stacked.

In some embodiments, the first and second bit lines may extend in parallel along one direction when viewed from a plan view.

In still another aspect, a semiconductor memory device may include: a source line; a first bit line and a second bit line extending in parallel along one direction; a first variable resistance memory element connected between the source line and the first bit line; and a second variable resistance memory element connected between the source line and the second bit line. Each of the first and second variable resistance memory elements may include: a pinned magnetic layer; a free magnetic layer; and a tunnel barrier layer disposed between the pinned and free magnetic layers. The free magnetic layer of the first variable resistance memory element may be adjacent the first bit line, and the pinned magnetic layer of the second variable resistance memory element may be adjacent the second bit line.

In some embodiments, the first bit line and the second bit line may be disposed at different heights from a top surface of a semiconductor substrate, and the first and second variable resistance memory elements may be disposed at the substantially same height from the top surface of the semiconductor substrate.

In some embodiments, the first bit line and the second bit line may be disposed at the substantially same height from a top surface of a semiconductor substrate, and the first variable resistance memory element and the second variable resistance memory element may be disposed at different heights from the top surface of the semiconductor substrate.

BRIEF DESCRIPTION OF THE DRAWINGS

The inventive concepts will become more apparent in view of the attached drawings and accompanying detailed description.

DETAILED DESCRIPTION

Figure 1:
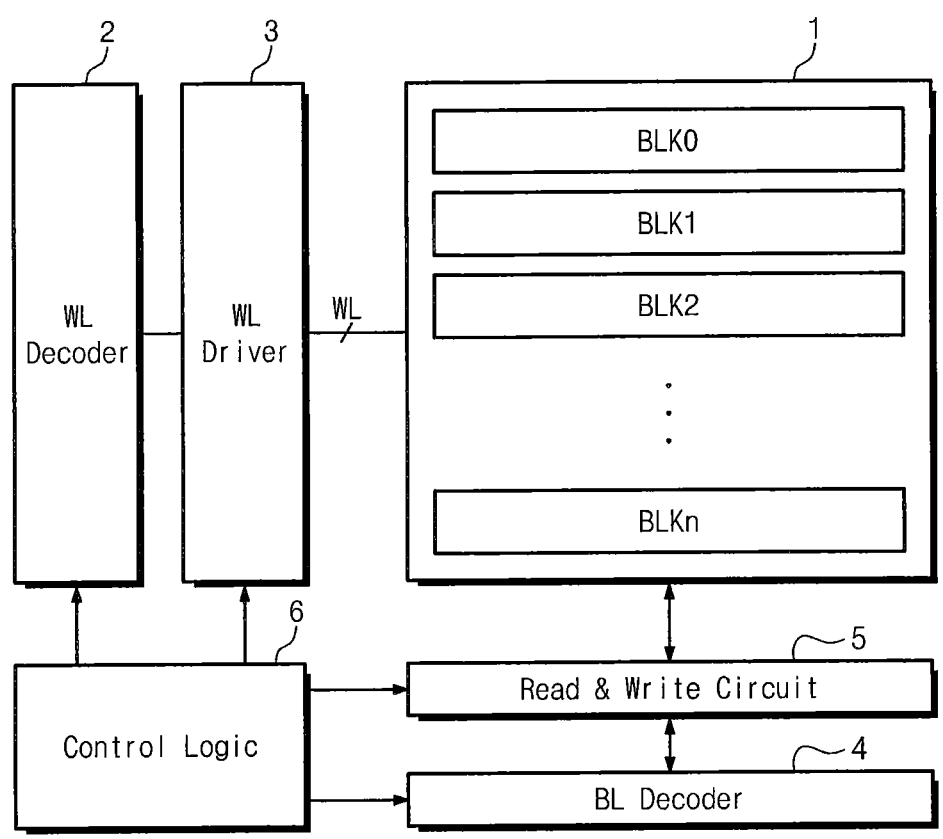
FIG. 1 is a schematic block diagram illustrating a semiconductor memory device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, some embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a semiconductor memory device according to example embodiments of the inventive concepts. Referring to FIG. 1, a semiconductor memory device may include a memory cell array 1, a word line decoder 2, a word line driver 3, a bit line decoder 4, a read and write circuit 5, and a control logic 6.

The memory cell array 1 may include a plurality of memory blocks BLK0 to BLKn, and each of the memory blocks BLK0 to BLKn may include a plurality of memory cells, a plurality of word lines, a plurality of bit lines, and a plurality of source lines. The word lines, the bit lines, and source lines may be electrically connected to the memory cells in each of the memory blocks BLK0 to BLKn.

The word line decoder 2 decodes an address signal inputted from an external device to select one of the word lines. The address signal decoded in the word line decoder 2 may be provided to the word line driver 3. The word line driver 3 may provide word line voltages generated from a voltage generating circuit (not shown) to the selected word line and unselected word lines in response to a control signal of the control logic 6. The word line decoder 2 and the word line driver 3 may be connected in common to the plurality of memory blocks BLK0 to BLKn and may provide driving signals to word lines of one selected from among the memory blocks BLK0 to BLKn in response to a block selection signal.

The bit line decoder 4 decodes an address signal inputted from the external device to select one of the bit lines. The bit line decoder 4 may be connected in common to the plurality of memory blocks BLK0 to BLKn and may provide data information to the bit lines of a selected one of the memory blocks BLK0 to BLKn in response to the block selection signal.

The read and write circuit 5 is connected to the memory cell array 1 through the bit lines. The read and write circuit 5 may select one of the bit lines in response to a bit line selection signal (not shown) inputted from the bit line decoder 4. The read and write circuit 5 may be configured to exchange data with the external device. The read and write circuit 5 is operated in response to a control signal of the control logic 6. The read and write circuit 5 receives a power (e.g., a voltage or a current) from the control logic 6 and provides the power to the selected bit line.

The control logic 6 controls overall operations of the semiconductor memory device. The control logic 6 may receive control signals and an external voltage and may be operated in response to the received control signals. The control logic 6 may generate powers necessary for internal operations by using the external voltage. The control logic 6 controls read, write, and/or erase operations in response to the control signals.

Figure 2:
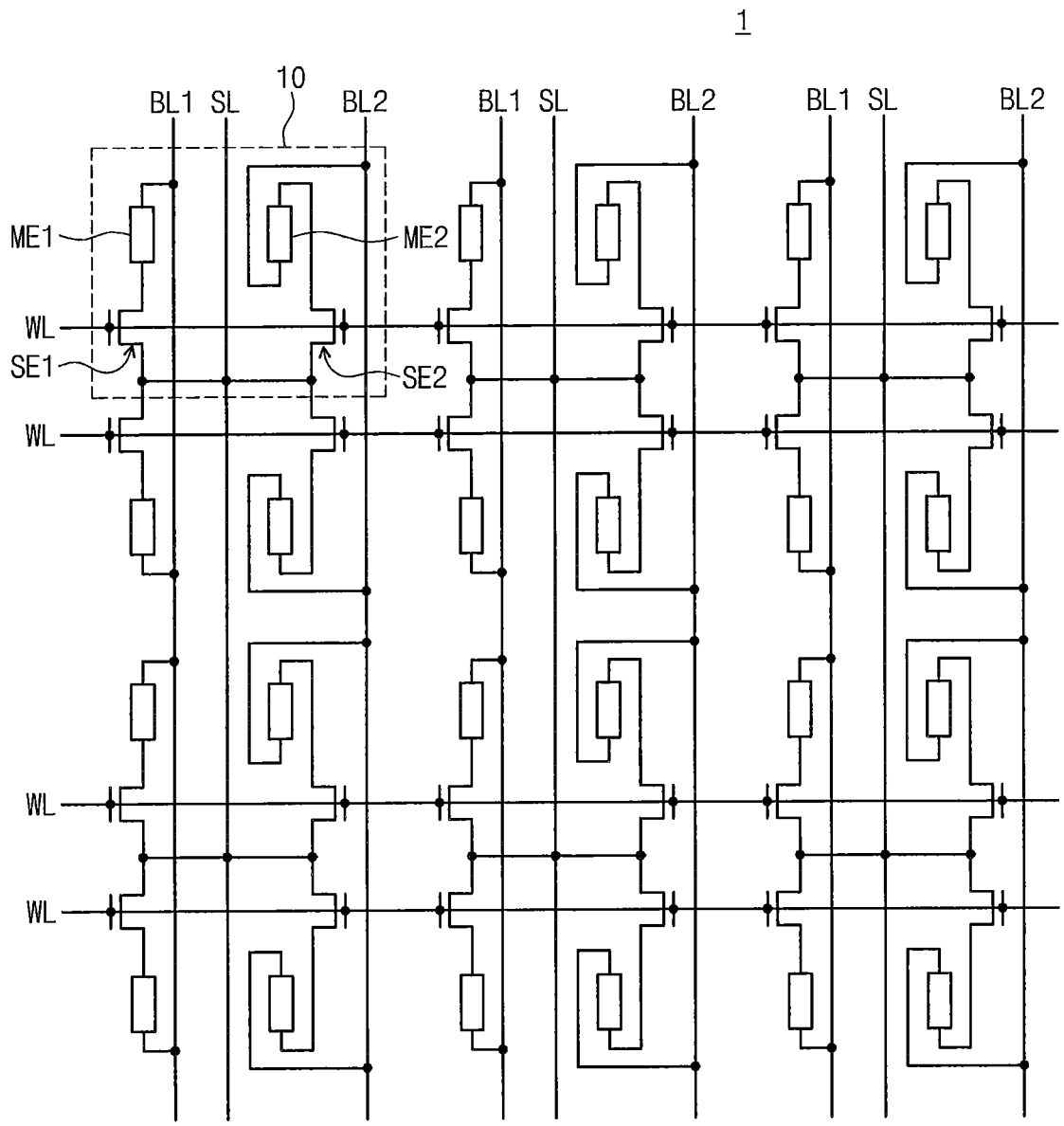
FIG. 2 is a circuit diagram illustrating a cell array of a semiconductor memory device according to some embodiments of the inventive concepts.

FIG. 2 is a circuit diagram illustrating a cell array of a semiconductor memory device according to some embodiments of the inventive concepts. Referring to FIG. 2, a cell array 1 may include a plurality of word lines WL, bit lines BL1 and BL2, source lines SL, and unit memory cells 10. The bit lines BL1 and BL2 may be arranged to intersect the word lines WL, and the source lines SL may be parallel to the bit lines BL1 and BL2 and/or the word lines WL.

In some embodiments, each of the unit memory cells 10 may be connected between the word line WL and a pair of bit lines BL1 and BL2 intersecting the word line WL. Each of the unit memory cells 10 may include first and second memory elements ME1 and ME2 and first and second selection elements SE1 and SE2.

In more detail, the first memory element ME1 may be connected between the first selection element SE1 and a first bit line BL1, and the second memory element ME2 may be connected between the second selection element SE2 and a second bit line BL2. The first selection element SE1 may be connected between the first memory element ME1 and the source line SL, and the second selection element SE2 may be connected between the second memory element ME2 and the source line SL. The first and second selection elements SE1 and SE2 may share one source line SL and may be controlled by the same word line WL. In addition, a plurality of unit memory cells 10 arranged in a first direction or a second direction perpendicular to the first direction may be connected in common to the source line SL.

According to some embodiments, one unit memory cell 10 may be selected by one word line WL and a pair of bit lines BL1 and BL2. According to embodiments of the inventive concepts, each of the first and second memory elements ME1 and ME2 may be a variable resistance element that is switchable between two resistance states by an electric pulse applied thereto. Materials of the first and second memory elements ME1 and ME2 may have a resistance value variable according to a magnitude and/or a direction of a current or voltage and a non-volatile characteristic maintaining a stored resistance value even though a current or voltage is interrupted. In some embodiments, the first and second memory elements ME1 and ME2 may have thin-layered structures exhibiting a magnetoresistance characteristic. In this case, the first and second memory elements ME1 and ME2 may include at least one ferromagnetic material and/or at least one anti-ferromagnetic material. In other embodiments, the first and second memory elements ME1 and ME2 may include at least one of perovskite compounds or at least one of transition metal oxides.

Each of the first and second selection elements SE1 and SE2 may be one of a diode, a PNP bipolar transistor, an NPN bipolar transistor, an NMOS field effect transistor (NMOS-FET), and a PMOS field effect transistor (PMOS-FET). In some embodiments, the first and second selection elements SE1 and SE2 may control currents supplied to the first and second memory elements ME1 and ME2 according to a voltage applied to the word line WL. In some embodiments, each of the first and second selection elements SE1 and SE2 may be a MOS field effect transistor (MOS-FET).

Figure 3:
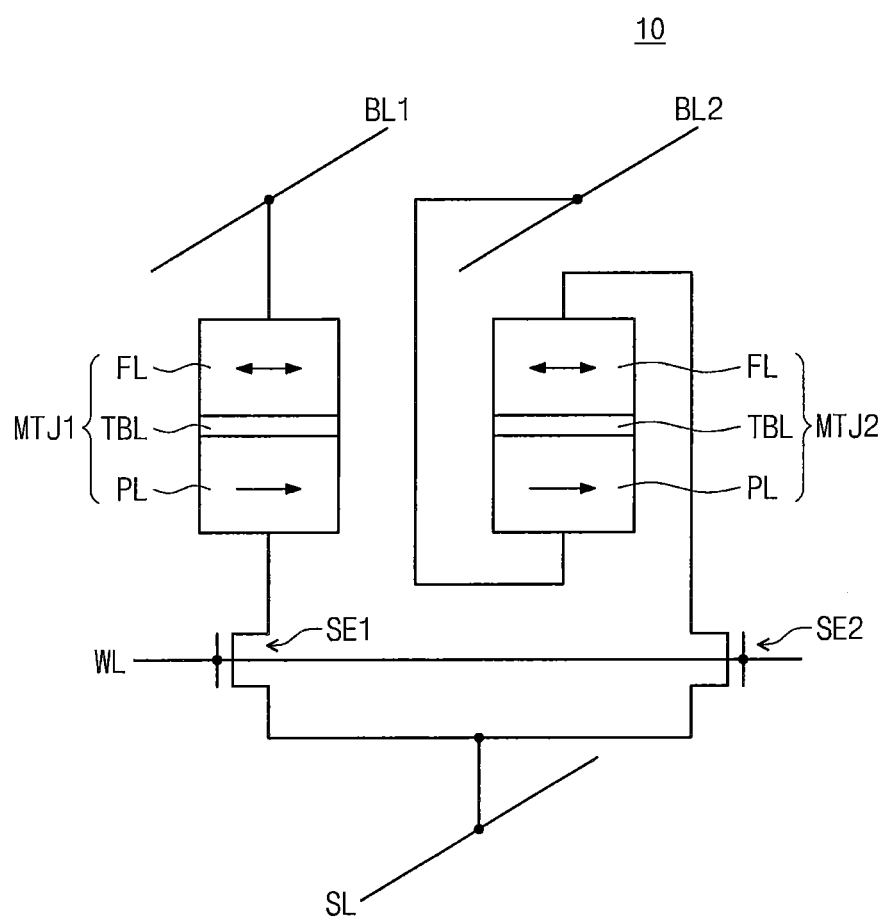
FIG. 3 is a diagram illustrating a unit memory cell of a semiconductor memory device according to some embodiments of the inventive concepts.
Figure 4:
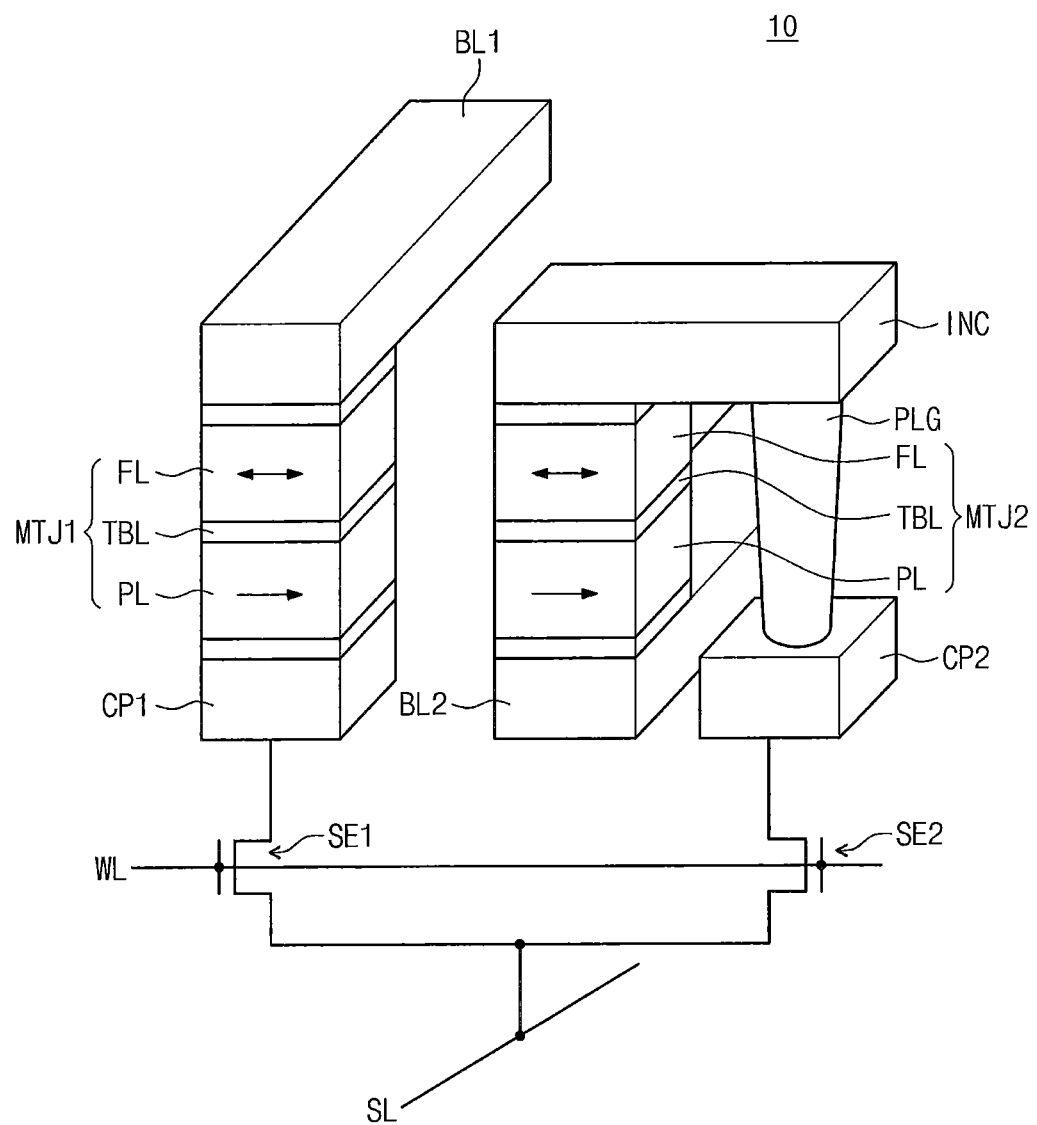
FIGS. 4 and 5 are perspective views illustrating examples of a unit memory cell of a semiconductor memory device according to some embodiments of the inventive concepts.
Figure 5:
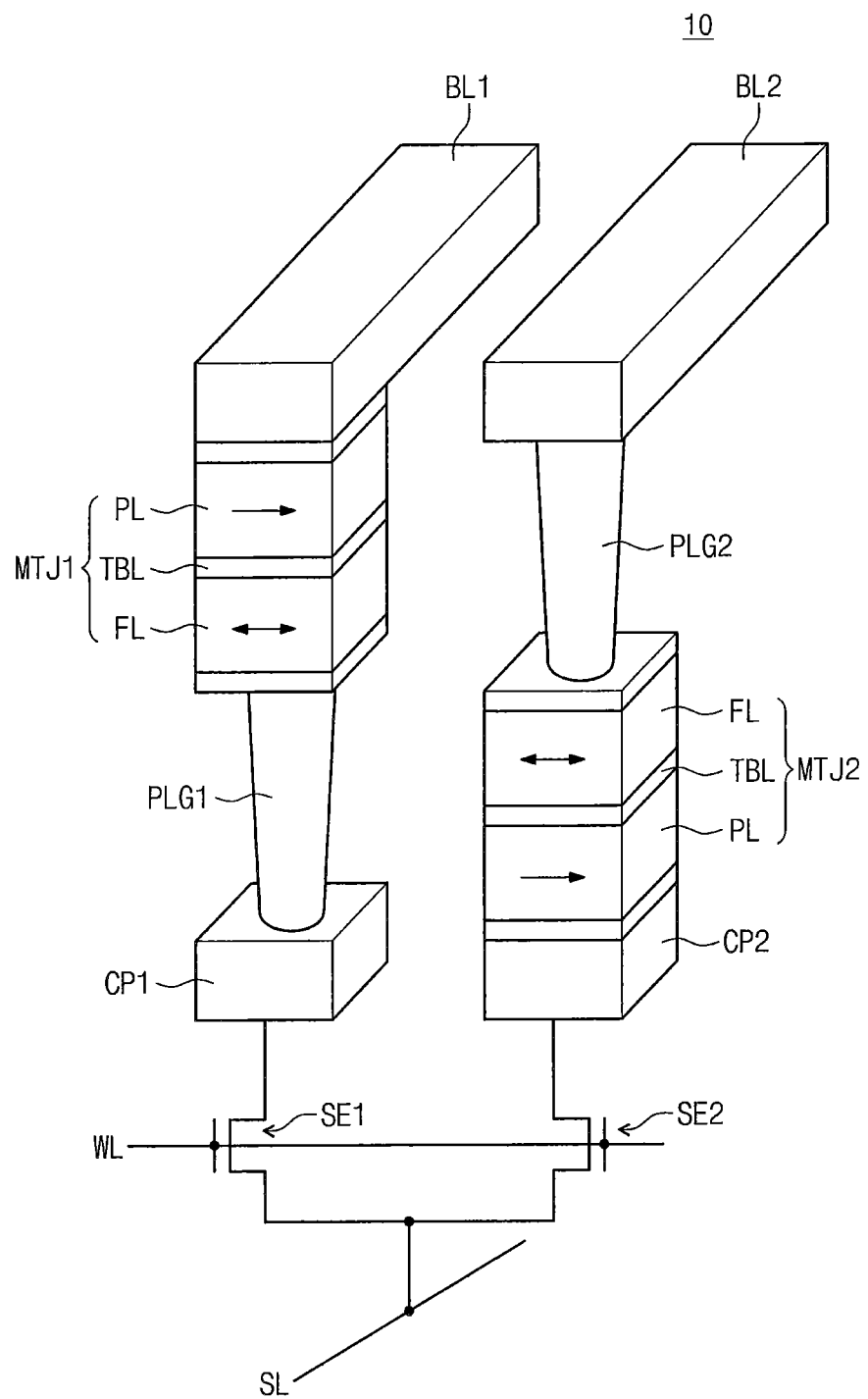

FIG. 3 is a diagram illustrating a unit memory cell of a semiconductor memory device according to some embodiments of the inventive concepts. FIGS. 4 and 5 are perspective views illustrating examples of a unit memory cell of a semiconductor memory device according to some embodiments of the inventive concepts.

Referring to FIG. 3, a unit memory cell 10 may include first and second magnetic tunnel junctions MTJ1 and MTJ2 used as the first and second memory elements and first and second selection transistors SE1 and SE2 used as the first and second selection elements. In some embodiments, each of the first and second magnetic tunnel junctions MTJ1 and MTJ2 may include a pinned layer PL, a free layer FL, and a tunnel barrier layer TBL disposed between the pinned layer PL and the free layer FL. The pinned layer PL has a magnetization direction fixed in one direction, and the free layer FL has a magnetization direction that is changeable to be parallel or anti-parallel to the magnetization direction of the pinned layer PL.

An electrical resistance value of each of the first and second magnetic tunnel junctions MTJ1 and MTJ2 may be changed according to the magnetization directions of the free layer FL and the pinned layer PL. If the magnetization directions of the pinned layer PL and the free layer FL are parallel to each other, each of the first and second magnetic tunnel junctions MTJ1 and MTJ2 has a first resistance value. If the magnetization directions of the pinned layer PL and the free layer FL are anti-parallel to each other, each of the first and second magnetic tunnel junctions MTJ1 and MTJ2 has a second resistance value greater than the first resistance value. In other words, the electrical resistance values of the first and second magnetic tunnel junctions MTJ1 and MTJ2 may be varied by changing the magnetization direction of the free layer FL, and data '0' or data '1' may be written in the first and second magnetic tunnel junctions MTJ1 and MTJ2 by this electrical resistance characteristic.

In more detail, first and second bit lines BL1 and BL2 may be disposed to intersect a word line WL, and a source line SL may be connected in common to the first and second selection transistors SE1 and SE2. The first magnetic tunnel junction MTJ1 may be connected between the first bit line BL1 and the first selection transistor SE1, and the first selection transistor SE1 may be connected between the first magnetic tunnel junction MTJ1 and the source line SL. Here, the free layer FL of the first magnetic tunnel junction MTJ1 may be connected to the first bit line BL1, and the pinned layer PL of the first magnetic tunnel junction MTJ1 may be connected to the first selection transistor SE1. The second magnetic tunnel junction MTJ2 may be connected between the second bit line BL2 and the second selection transistor SE2, and the second selection transistor SE2 may be connected between the second magnetic tunnel junction MTJ2 and the source line SL. Here, the free layer FL of the second magnetic tunnel junction MTJ2 may be connected to the second selection transistor SE2, and the pinned layer PL of the second magnetic tunnel junction MTJ2 may be connected to the second bit line BL2.

Referring to FIG. 4, in a unit memory cell 10 according to an embodiment, the first magnetic tunnel junction MTJ1 may have the same stack structure as the second magnetic tunnel junction MTJ2. In addition, the first and second magnetic tunnel junctions MTJ1 and MTJ2 may be disposed at the same level. For example, each of the first and second magnetic tunnel junctions MTJ1 and MTJ2 may have the pinned layer PL, the tunnel barrier layer TBL, and the free layer which are sequentially stacked. In the unit memory cell 10, the first bit line BL1 and the second bit line BL2 may be disposed at different levels (or different heights) from each other.

In more detail, the first magnetic tunnel junction MTJ1 may be stacked on a first conductive pattern CP1 connected to the first selection transistor SE1. The first bit line BL1 may extend in one direction on the first magnetic tunnel junction MTJ1. The first bit line BL1 may be adjacent the free layer FL of the first magnetic tunnel junction MTJ1. The second magnetic tunnel junction MTJ2 may be stacked on the second bit line BL2 extending in one direction, and the pinned layer PL of the second magnetic tunnel junction MTJ2 may be adjacent the second bit line BL2. In some embodiments, the second bit line BL2 may be disposed at the same level (or the same height) as the first conductive pattern CP1. An interconnection pattern INC may be disposed on the second magnetic tunnel junction MTJ2. The interconnection pattern INC may be electrically connected to the second selection transistor SE2 through a contact plug PLG and a second conductive pattern CP2. In some embodiments, the interconnection pattern INC may be disposed at a substantially same level as the first bit line BL1.

Referring to FIG. 5, in a unit memory cell 10 according to some embodiments, first and second magnetic tunnel junctions MTJ1 and MTJ2 may have opposite stack structures to each other. In addition, the first and second magnetic tunnel junctions MTJ1 and MTJ2 may be disposed at different levels from each other. For example, the first magnetic tunnel junction MTJ1 may have a stack structure including the free layer FL, the tunnel barrier layer TBL, and the pinned layer PL which are sequentially stacked. The second magnetic tunnel junction MTJ2 may have a stack structure including the pinned layer PL, the tunnel barrier layer TBL, and the free layer FL which are sequentially stacked. In the unit memory cell 10, first and second bit lines BL1 and BL2 may be disposed at the same level (or the same height).

In more detail, a first conductive pattern CP1 connected to the first selection transistor SE1 may be disposed at the same level as a second conductive pattern CP2 connected to the second selection transistor SE2. The first and second bit lines BL1 and BL2 may extend in parallel over the first and second conductive patterns CP1 and CP2. In a vertical view, a first contact plug PLG1 and the first magnetic tunnel junction MTJ1 may be disposed between the first bit line BL1 and the first conductive pattern CP1. The first contact plug PLG1 may be in direct contact with the first conductive pattern CP1, and the first magnetic tunnel junction MTJ1 may be in direct contact with the first bit line BL1. Here, the pinned layer PL of the first magnetic tunnel junction MTJ1 may be adjacent the first bit line BL1. In a vertical view, a second contact plug PLG2 and the second magnetic tunnel junction MTJ2 may be disposed between the second bit line BL2 and the second conductive pattern CP2. The second contact plug PLG2 may be in direct contact with the second bit line BL2, and the second magnetic tunnel junction MTJ2 may be in direct contact with the second conductive pattern CP2. Here, the pinned layer PL of the second magnetic tunnel junction MTJ2 may be adjacent the second conductive pattern CP2.

Figure 6:
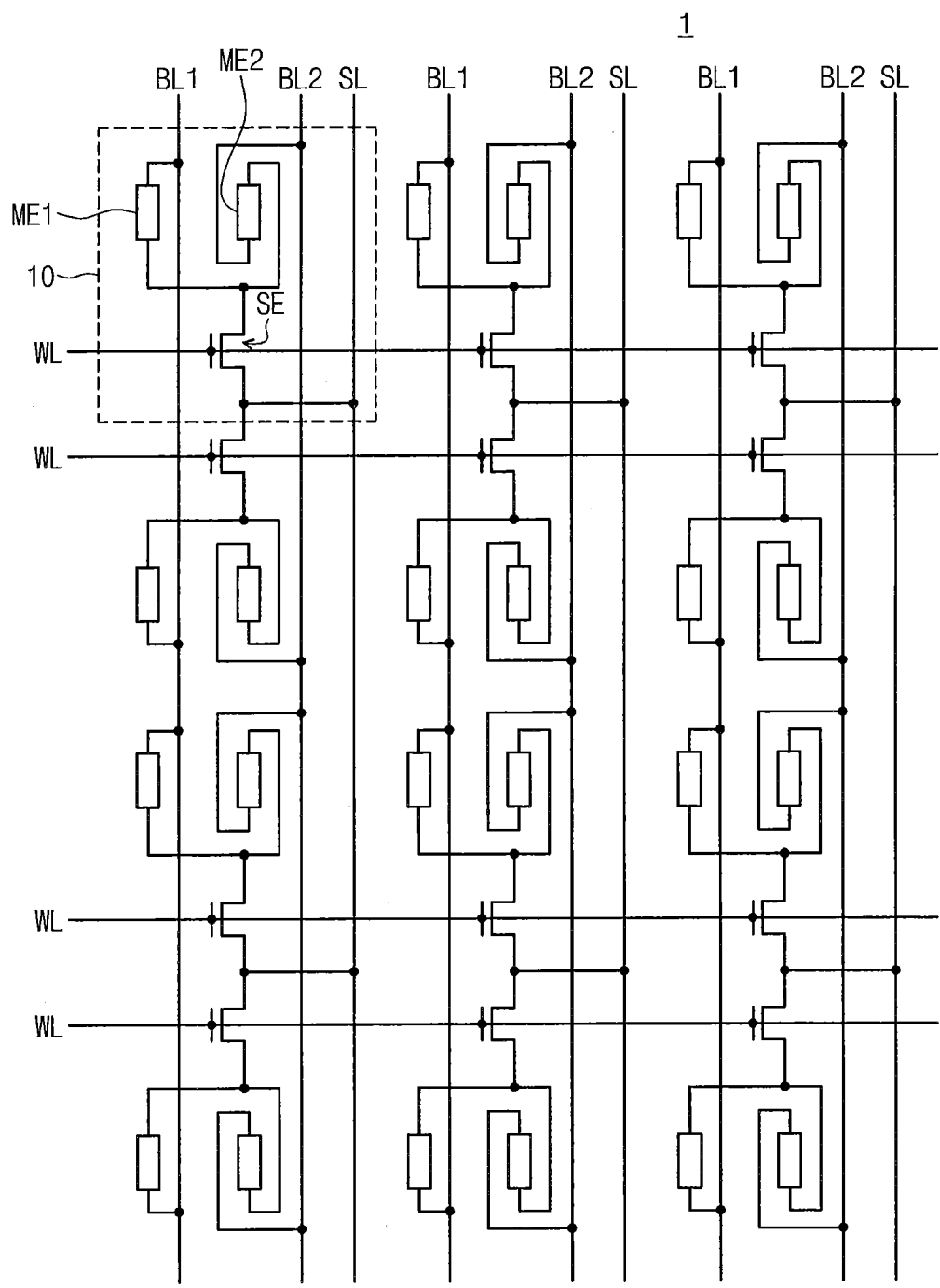
FIGS. 6 and 7 are circuit diagrams illustrating cell arrays of semiconductor memory devices according to other embodiments of the inventive concepts.
Figure 7:
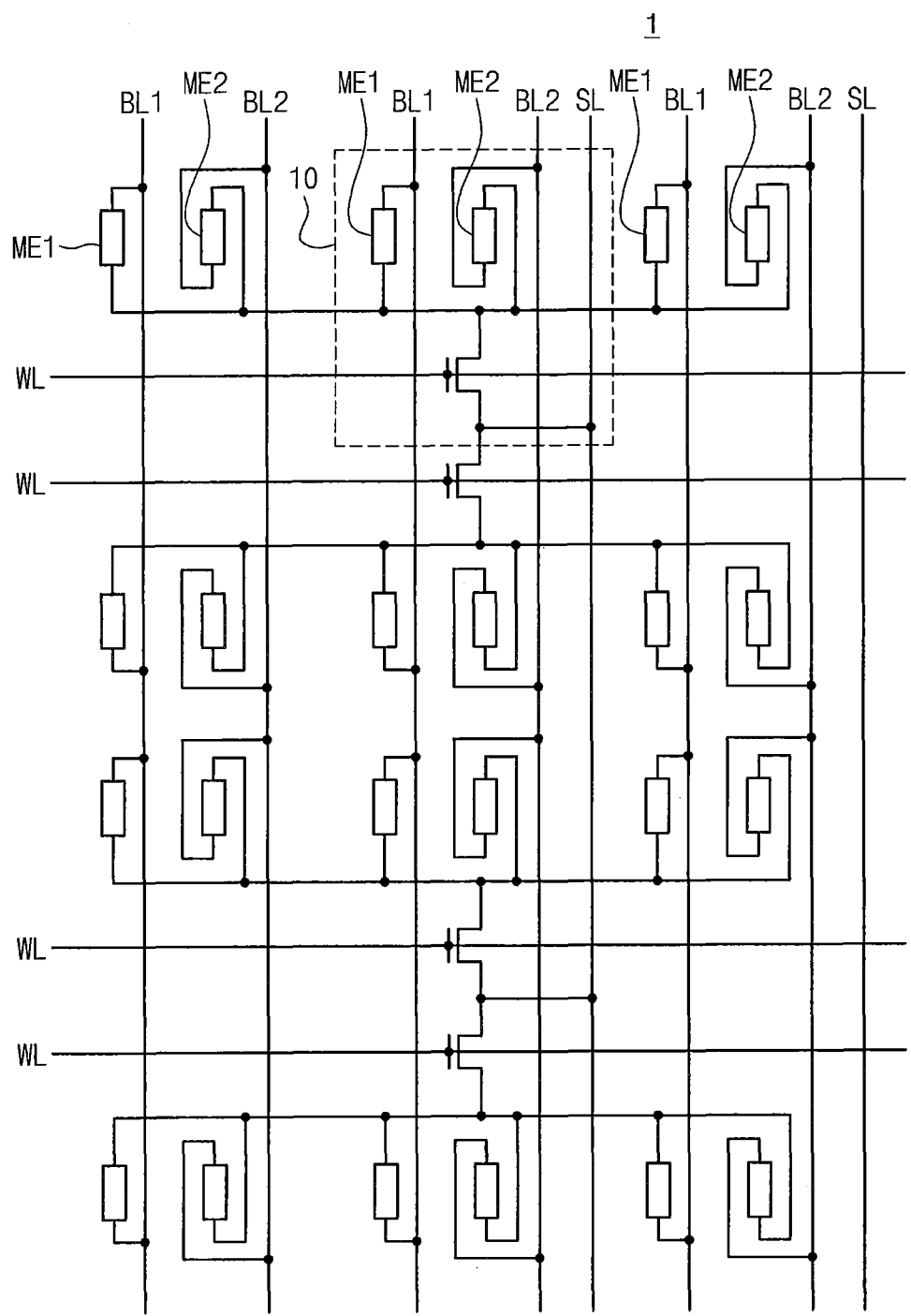

FIGS. 6 and 7 are circuit diagrams illustrating cell arrays of semiconductor memory devices according to some embodiments of the inventive concepts. Referring to FIG. 6, a cell array 1 according to some embodiments may include a plurality of word lines WL, bit lines BL1 and BL2, source lines SL, and unit memory cells 10. The bit lines BL1 and BL2 may be arranged to intersect the word lines WL, and the source lines SL may be parallel to the bit lines BL1 and BL2 or the word lines WL.

In some embodiments, the unit memory cells 100 may be arranged along a first direction and a second direction perpendicular to the first direction, and each of the unit memory cells 100 may be connected between the word line WL and a pair of bit lines BL1 and BL2 intersecting the word line WL. In some embodiments, each of the unit memory cells 10 may include first and second memory elements ME1 and ME2 and a selection element SE. In the present embodiment, the first and second memory elements ME1 and ME2 may share one selection element SE. In more detail, the first memory element ME1 may be connected between a first bit line BL1 and the selection element SE, and the second memory element ME2 may be connected between a second bit line BL2 and the selection element SE. A plurality of unit memory cells 10 arranged in the first direction or the second direction may share the source line SL.

In some embodiments, as illustrated in FIG. 7, the unit memory cells 10 may be arranged in the first and second directions, and a plurality of unit memory cells 10 arranged in the first direction may share one selection element SE. Each of the unit memory cells 10 may include the first memory element ME1 connected to the first bit line BL1 and the second memory element ME2 connected to the second bit line BL2. In some embodiments, a plurality of the first memory elements ME1 and a plurality of the second memory elements ME2 may be connected in common to one selection element SE.

Figure 8:
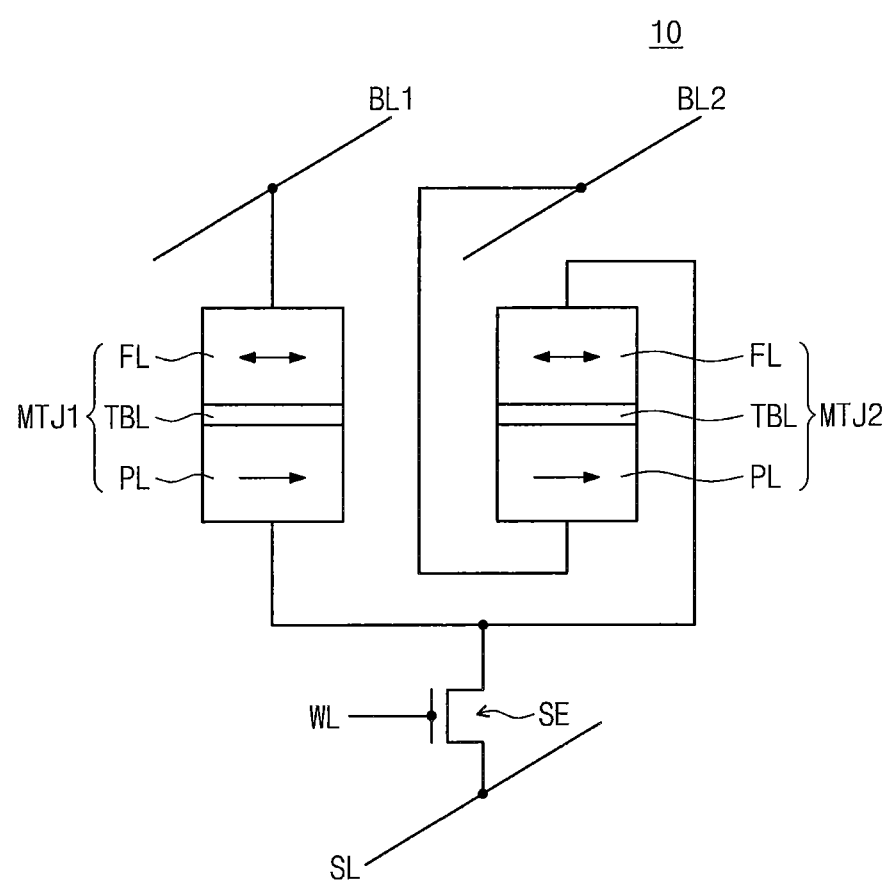
FIG. 8 is a diagram illustrating a unit memory cell of a semiconductor memory device according to other embodiments of the inventive concepts.
Figure 9:
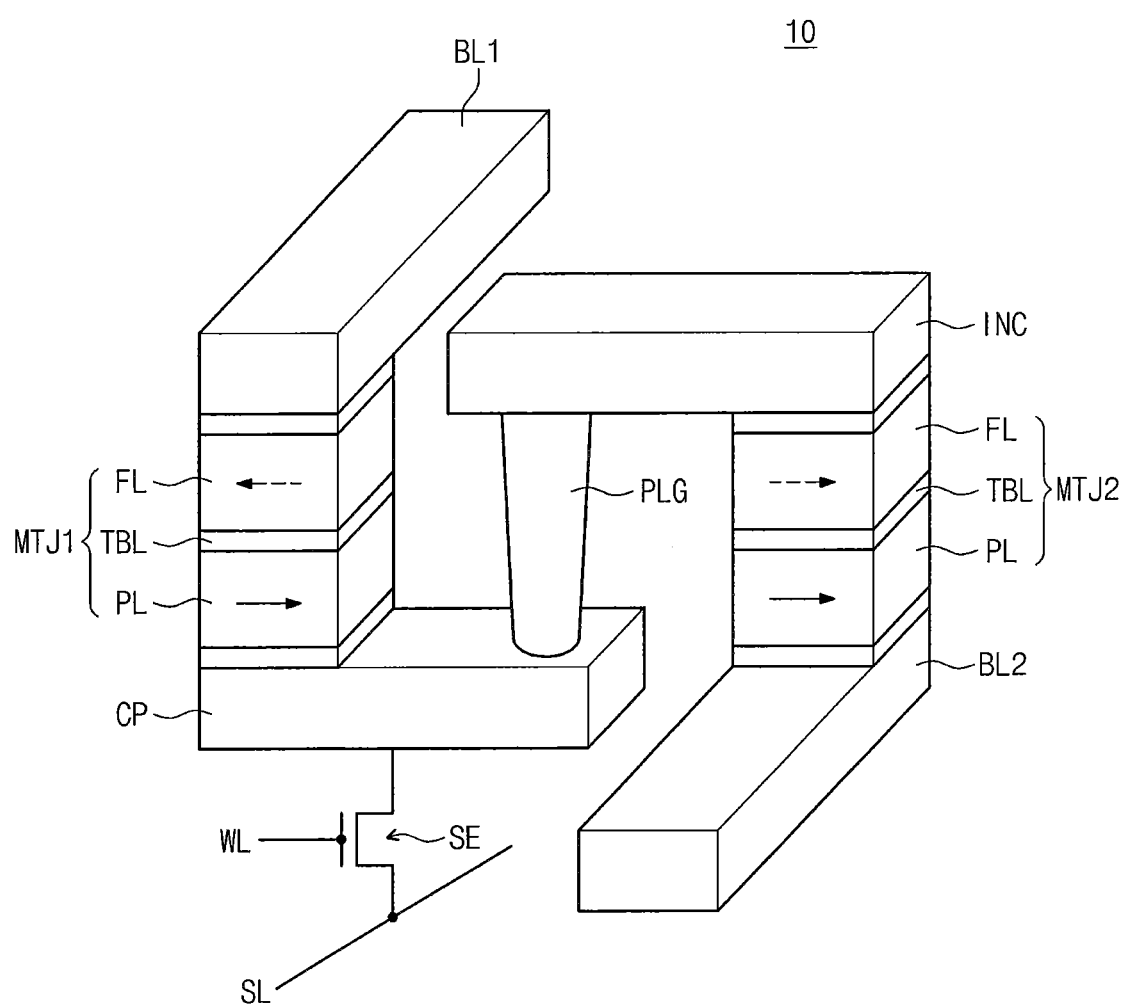
FIGS. 9 and 10 are perspective views illustrating examples of a unit memory cell of a semiconductor memory device according to other embodiments of the inventive concepts.
Figure 10:
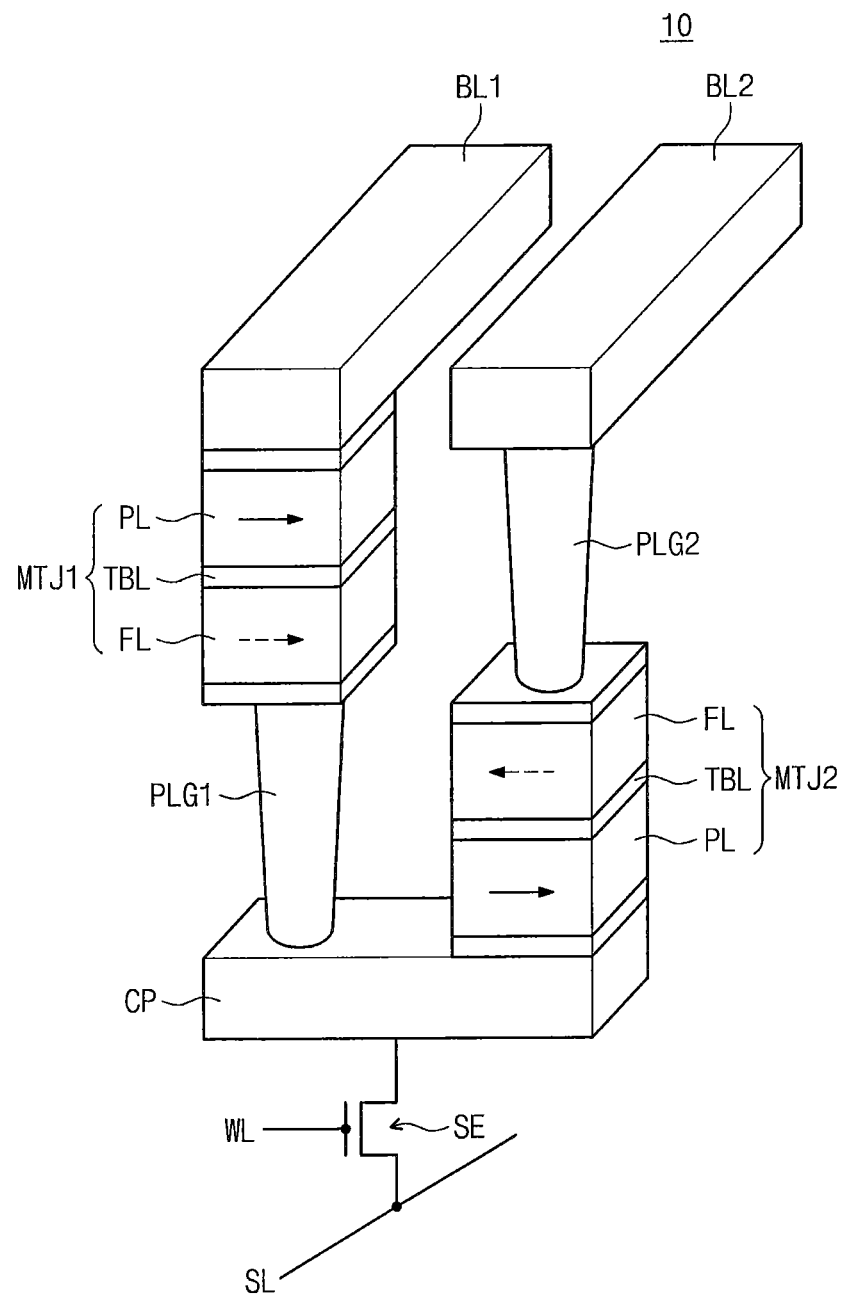

FIG. 8 is a diagram illustrating a unit memory cell of a semiconductor memory device according to some embodiments of the inventive concepts. FIGS. 9 and 10 are perspective views illustrating examples of a unit memory cell of a semiconductor memory device according to some embodiments of the inventive concepts.

Referring to FIG. 8, a unit memory cell 10 may include first and second magnetic tunnel junctions MTJ1 and MTJ2 used as the memory elements and a selection transistor SE used as the selection element.

According to some embodiments, each of the first and second magnetic tunnel junctions MTJ1 and MTJ2 may include a pinned layer PL, a free layer FL, and a tunnel barrier layer TBL disposed therebetween. The pinned layer PL has a magnetization direction fixed in one direction, and the free layer FL has a magnetization direction that is changeable to be parallel or anti-parallel to the magnetization direction of the pinned layer PL.

In more detail, first and second bit lines BL1 and BL2 may be disposed to intersect a word line WL, and the selection transistor SE may be connected in common to the first and second magnetic tunnel junctions MTJ1 and MTJ2. In other words, the first magnetic tunnel junction MTJ1 may be connected between the first bit line BL1 and the selection transistor SE, and the second magnetic tunnel junction MTJ2 may be connected between the second bit line BL2 and the selection transistor SE. Here, the free layer FL of the first magnetic tunnel junction MTJ1 may be connected to the first bit line BL1, and the pinned layer PL of the second magnetic tunnel junction MTJ2 may be connected to the second bit line BL2. The pinned layer PL of the first magnetic tunnel junction MTJ1 and the free layer FL of the second magnetic tunnel junction MTJ2 may be connected to the selection transistor SE.

Referring to FIG. 9, in the unit memory cell 10, the first and second magnetic tunnel junctions MTJ1 and MTJ2 may have the same stack structure. In addition, the first and second magnetic tunnel junctions MTJ1 and MTJ2 may be disposed at the same level (or the same height). For example, each of the first and second magnetic tunnel junctions MTJ1 and MTJ2 may have a structure including a pinned layer PL, a tunnel barrier layer TBL, and a free layer FL, which are sequentially stacked. In the unit memory cell 10, first and second bit lines BL1 and BL2 may be disposed at different levels from each other.

In more detail, the first magnetic tunnel junction MTJ1 may be stacked on a conductive pattern CP connected to the selection transistor SE. The first bit line BL1 extending in one direction may be disposed on the first magnetic tunnel junction MTJ1, and the first bit line BL1 may be adjacent the free layer FL of the first magnetic tunnel junction MTJ1.

The second magnetic tunnel junction MTJ2 may be stacked on the second bit line BL2 extending in one direction, and the pinned layer PL of the second magnetic tunnel junction MTJ2 may be adjacent the second bit line BL2. In some embodiments, the second bit line BL2 may be disposed at the same level (or the same height) as the conductive pattern CP. An interconnection pattern INC may be disposed on the second magnetic tunnel junction MTJ2. The interconnection pattern INC may be electrically connected to the conductive pattern CP through a contact plug PLG.

Referring to FIG. 10, first and second magnetic tunnel junctions MTJ1 and MTJ2 may have opposite stack structures to each other. In addition, the first and second magnetic tunnel junctions MTJ1 and MTJ2 may be disposed at different levels from each other in the unit memory cell 10. For example, the first magnetic tunnel junction MTJ1 may have a stack structure including the free layer FL, the tunnel barrier layer TBL, and the pinned layer PL which are sequentially stacked. The second magnetic tunnel junction MTJ2 may have a stack structure including the pinned layer PL, the tunnel barrier layer TBL, and the free layer FL which are sequentially stacked. In the unit memory cell 10, first and second bit lines BL1 and BL2 may be disposed at the same level (or the same height).

In more detail, a first contact plug PLG1 and the second magnetic tunnel junction MTJ2 may be disposed on the conductive pattern CP connected to the selection transistor SE. The first contact plug PLG1 may be laterally spaced apart from the second magnetic tunnel junction MTJ2. The first and second bit lines BL1 and BL2 extending in parallel along one direction may be disposed over the conductive pattern CP.

The first magnetic tunnel junction MTJ1 may be connected between the first bit line BL1 and the first contact plug PLG1, and the second magnetic tunnel junction MTJ2 may be connected between a second contact plug PLG2 and the second bit line BL2. Here, the pinned layer PL of the first magnetic tunnel junction MTJ1 may be adjacent the first bit line BL1, and the pinned layer PL of the second magnetic tunnel junction MTJ2 may be adjacent the conductive pattern CP.

Figures 11, 12:
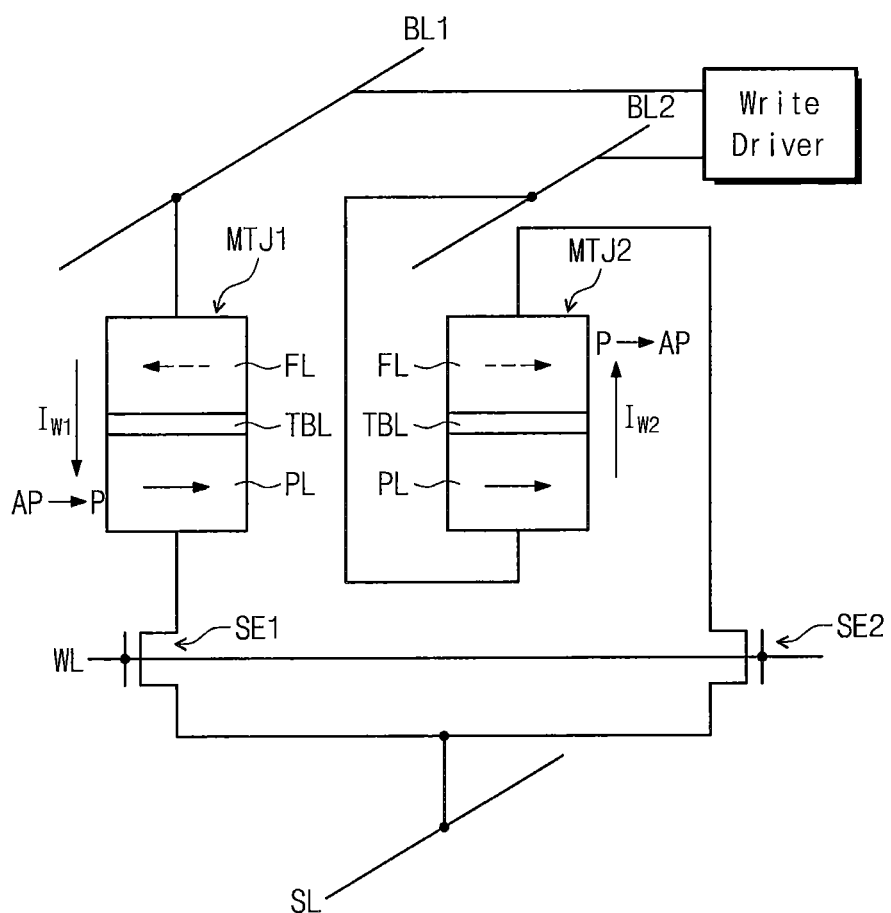
FIG. 11 is a table showing driving voltages of a semiconductor memory device according to example embodiments of the inventive concepts.
FIGS. 12 and 13 are diagrams illustrating write operations of a semiconductor memory device according to example embodiments of the inventive concepts.
Figure 13:
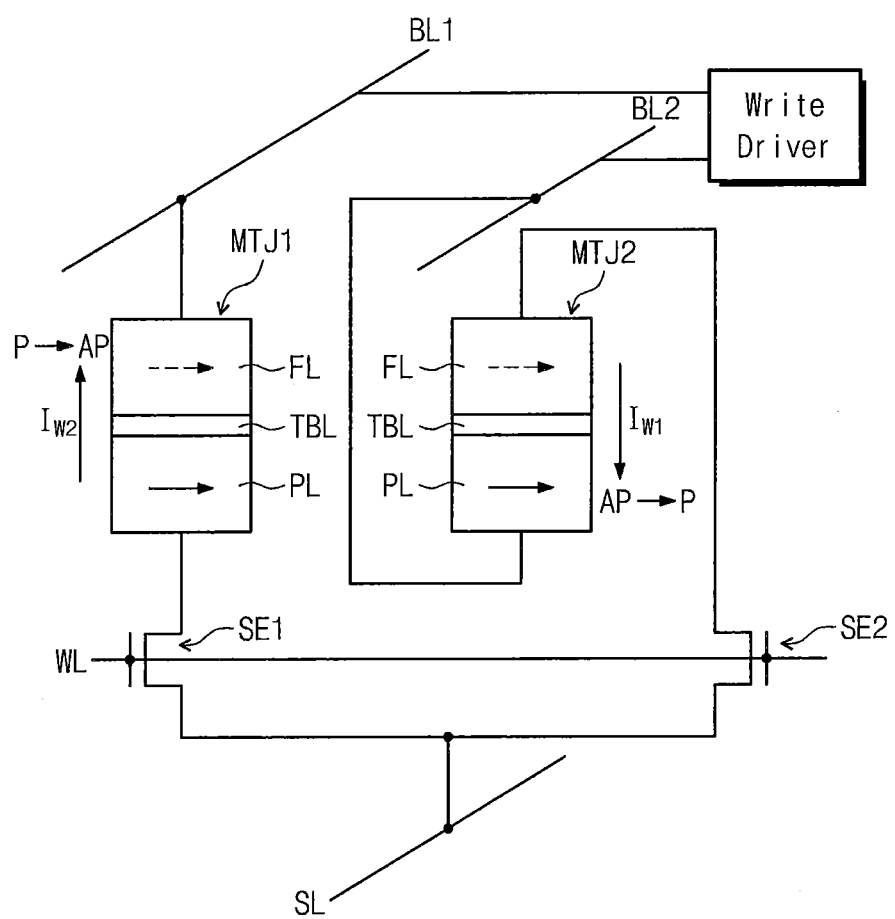
Figure 14:
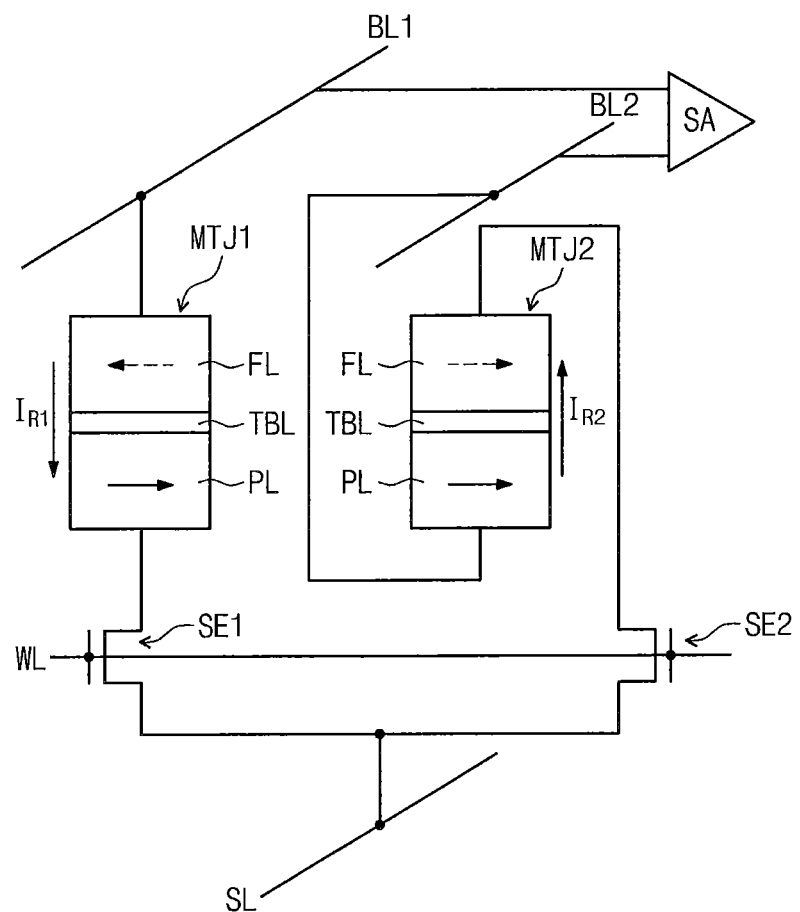
FIG. 14 is a diagram illustrating a read operation of a semiconductor memory device according to example embodiments of the inventive concepts.

Hereinafter, methods of operating the semiconductor memory device according to embodiments of the inventive concepts will be described in detail with reference to FIGS. 11 to 14. FIG. 11 is a table showing driving voltages in operation of a semiconductor memory device according to some embodiments of the inventive concepts. FIGS. 12 and 13 are diagrams illustrating write operations of a semiconductor memory device according to some example embodiments of the inventive concepts. FIG. 14 is a diagram illustrating a read operation of a semiconductor memory device according to some example embodiments of the inventive concepts.

According to some embodiments, the first memory element and the second memory element may have resistance states opposite to each other when data may be written into or read from a selected memory cell. For example, if the first memory element has a high-resistance state, the second memory element may have a low-resistance state.

Referring to FIGS. 11 and 12, to write data '1' into a selected memory cell, a turn-on voltage Von may be applied to a selected word line WL and a turn-off voltage Voff may be applied to unselected word lines. A first bit line voltage $V_{BL1}$ may be applied to the first and second bit lines BL1 and BL2 that are selected, and a first source line voltage $V_{S1}$ may be applied to a selected source line SL (not illustrated). At this time, the first source line voltage $V_{S1}$ may be smaller than the first bit line voltage $V_{BL1}$. In addition, the first source line voltage $V_{S1}$ may also be applied to unselected source lines and unselected first and second bit lines.

Under the voltage condition described above, the first and second selection transistors SE1 and SE2 may be turned-on to electrically connect the first and second magnetic tunnel junctions MTJ1 and MTJ2 to the source line SL. A first write current $I_{W1}$ that flows from the selected first bit line BL1 to the source line SL may be provided to the first magnetic tunnel junction MTJ1, and a second write current $I_{W2}$ that flows from the selected second bit line BL2 to the source line SL may be provided to the second magnetic tunnel junction MTJ2. Here, a flowing direction of the first write current $I_{W1}$ may be opposite to a flowing direction of the second write current $I_{W2}$ from the viewpoint of the first and second magnetic tunnel junctions MTJ1 and MTJ2. In other words, in some embodiments, when the same voltage is applied to the first and second bit lines BL1 and BL2, the first and second magnetic tunnel junctions MTJ1 and MTJ2 may be supplied with write currents of which directions are opposite to each other.

In more detail, the first write current $I_{W1}$ is provided from the free layer FL to the pinned layer PL of the first magnetic tunnel junction MTJ1. In this case, electrons having spin directions that are parallel to the magnetization direction of the pinned layer PL may tunnel through the tunnel barrier layer TBL to apply torque to the free layer FL. Thus, in the first magnetic tunnel junction MTJ1, the magnetization direction of the free layer FL may be changed to be parallel to the magnetization direction of the pinned layer PL (anti-parallel state (AP)→parallel state (P)). On the other hand, the second write current $I_{W2}$ is provided from the pinned layer PL to the free layer FL of the second magnetic tunnel junction MTJ2. In this case, electrons having spin directions that are anti-parallel to the magnetization direction of the pinned layer PL may not tunnel through but may be reflected by the tunnel barrier layer TBL so as be accumulated in the free layer FL. Thus, the electrons may apply torque to the free layer FL in the second magnetic tunnel junction MTJ2. As a result, in the second magnetic tunnel junction MTJ2, the magnetization direction of the free layer FL may be changed to be anti-parallel to the magnetization direction of the pinned layer PL (P→AP).

As described above, when the data '1' is written in the selected memory cell, the magnetization directions of the free layer FL and the pinned layer PL of the first magnetic tunnel junction MTJ1 may be changed from the anti-parallel state to the parallel state (AP→P) but the magnetization directions of the free layer FL and the pinned layer PL of the second magnetic tunnel junction MTJ2 may be changed from the parallel state to the anti-parallel state (P→AP). In other words, the first magnetic tunnel junction MTJ1 may have the low-resistance state, and the second magnetic tunnel junction MTJ2 may have the high-resistance state.

Referring to FIGS. 11 and 13, when data '0' is written in a selected memory cell, the turn-on voltage Von may be applied to a selected word line WL and the turn-off voltage Voff may be applied to unselected word lines. A second bit line voltage $V_{BL2}$ may be applied to the first and second bit lines BL1 and BL2 that are selected, and a second source line voltage $V_{S2}$ greater than the second bit line voltage $V_{BL2}$ may be applied to a selected source line SL (not illustrated). In addition, the first source line voltage $V_{S1}$ may also be applied to unselected source lines and unselected first and second bit lines.

Under the voltage condition described above, the first and second selection transistors SE1 and SE2 may be turned-on to electrically connect the first and second magnetic tunnel junctions MTJ1 and MTJ2 to the source line SL. In addition, a second write current $I_{W2}$ that flows from the source line SL to the first bit line BL1 may be provided to the first magnetic tunnel junction MTJ1, and a first write current $I_{W1}$ which flows from the source line SL to the second bit line BL2 may be provided to the second magnetic tunnel junction MTJ2. Here, a flowing direction of the first write current $I_{W1}$ may be opposite to a flowing direction of the second write current $I_{W2}$ from the viewpoint of the first and second magnetic tunnel junctions MTJ1 and MTJ2.

In more detail, the second write current $I_{W2}$ is provided from the pinned layer PL to the free layer FL of the first magnetic tunnel junction MTJ1. In this case, electrons having spin directions which are anti-parallel to the magnetization direction of the pinned layer PL may not tunnel through but may be reflected by the tunnel barrier layer TBL so as be accumulated in the free layer FL. Thus, in the first magnetic tunnel junction MTJ1, the magnetization direction of the free layer FL may be changed to be anti-parallel to the magnetization direction of the pinned layer PL by the torque of the electrons (P→AP). On the other hand, the first write current $I_{W1}$ is provided from the free layer FL to the pinned layer PL of the second magnetic tunnel junction MTJ2. In this case, electrons having spin directions which are parallel to the magnetization direction of the pinned layer PL may tunnel through the tunnel barrier layer TBL to apply torque to the free layer FL. Thus, in the second magnetic tunnel junction MTJ2, the magnetization direction of the free layer FL may be changed to be parallel to the magnetization direction of the pinned layer PL (AP→P).

As described above, when the data '0' is written in the selected memory cell, the magnetization directions of the free layer FL and the pinned layer PL of the first magnetic tunnel junction MTJ1 may be changed from the parallel state to the anti-parallel state (P→AP) but the magnetization directions of the free layer FL and the pinned layer PL of the second magnetic tunnel junction MTJ2 may be changed from the anti-parallel state to the parallel state (AP→P). In other words, the first magnetic tunnel junction MTJ1 may have the high-resistance state, and the second magnetic tunnel junction MTJ2 may have the low-resistance state.

Referring to FIGS. 11 and 14, to read data from a selected memory cell, the turn-on voltage Von may be applied to a selected word line WL and the turn-off voltage Voff may be applied to unselected word lines. A read voltage $V_{READ}$ may be applied to first and second bit lines BL1 and BL2 that are selected, and the first source line voltage $V_{S1}$ may be applied to a selected source line SL. Here, the read voltage $V_{READ}$ may be smaller than the first bit line voltage $V_{BL1}$ and greater than the second bit line voltage $V_{BL2}$. In addition, the read voltage $V_{READ}$ may be greater than the first source line voltage $V_{S1}$ and smaller than the second source line voltage $V_{S2}$. Moreover, the first source line voltage $V_{S1}$ may be applied to the unselected source lines and unselected first and second bit lines.

Under the voltage condition described above, a first read current $I_{R1}$ may be provided to the first magnetic tunnel junction MTJ1 of the selected memory cell, and a second read current $I_{R2}$ may be provided to the second magnetic tunnel junction MTJ2 of the selected memory cell. Here, the first and second read currents $I_{R1}$ and $I_{R2}$ may be smaller than the first and second write currents $I_{W1}$ and $I_{W2}$ of FIGS. 12 and 13. In other words, the first and second read currents $I_{R1}$ and $I_{R2}$ provided to the first and second magnetic tunnel junctions MTJ1 and MTJ2 may not change the magnetization directions of the free layers FL of the first and second magnetic tunnel junctions MTJ1 and MTJ2. At this time, the first read current $I_{R1}$ may be varied according to the resistance value of the first magnetic tunnel junction MTJ1, and the second read current $I_{R2}$ may be varied according to the resistance value of the second magnetic tunnel junction MTJ2. Since the first and second magnetic tunnel junctions MTJ1 and MTJ2 have the resistance states opposite to each other, a magnitude of the first read current $I_{R1}$ may be different from that of the second read current $I_{R2}$.

A sense amplifier SA may sense a difference value between the first and second read currents $I_{R1}$ and $I_{R2}$ to read the data stored in the selected memory cell. Here, since the first and second magnetic tunnel junctions MTJ1 and MTJ2 have the resistance states opposite to each other, one of the resistance values of the first and second magnetic tunnel junctions MTJ1 and MTJ2 may be used as a reference resistance value. Thus, the sense amplifier SA may have a sensing margin that corresponds to the difference value between the first and second read currents $I_{R1}$ and $I_{R2}$.

One unit memory cell including two selection transistors is illustrated as an example in FIGS. 12, 13, and 14. However, the inventive concepts are not limited thereto. As illustrated in FIGS. 6 to 10, one unit memory cell including one selection transistor may be operated by the substantially same methods described with reference to FIGS. 11 to 14.

Figure 15A:
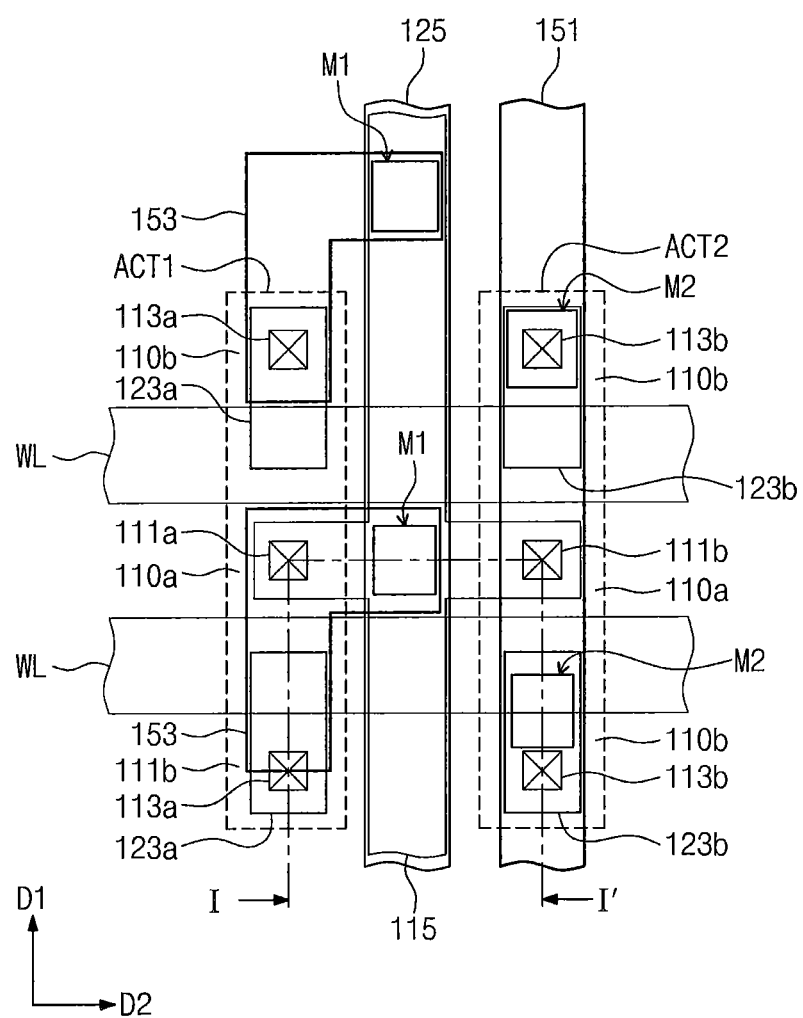
FIG. 15A is a plan view illustrating a semiconductor memory device according to a first embodiment of the inventive concepts.
Figure 15B:
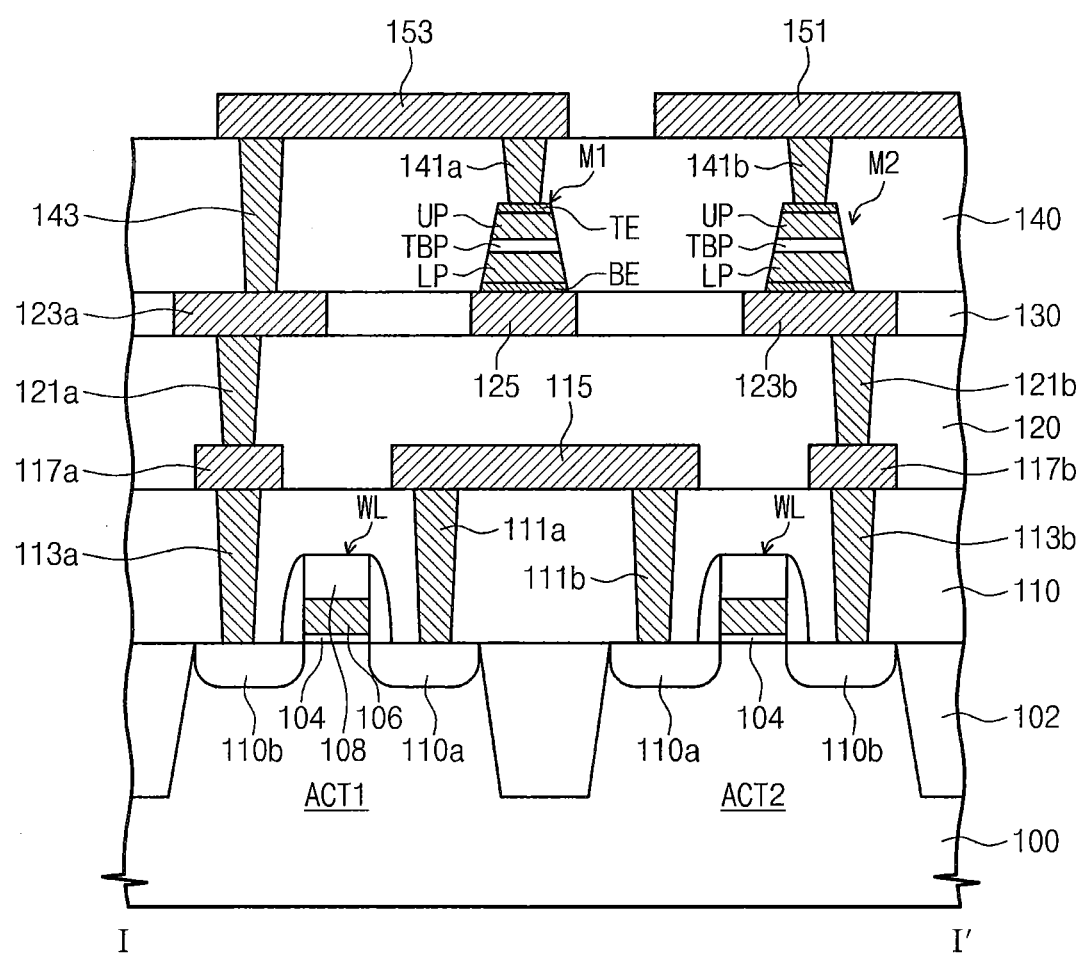
FIG. 15B is a cross-sectional view taken along a line of FIG. 15A to illustrate a semiconductor memory device according to a first embodiment of the inventive concepts.
Figure 15C:
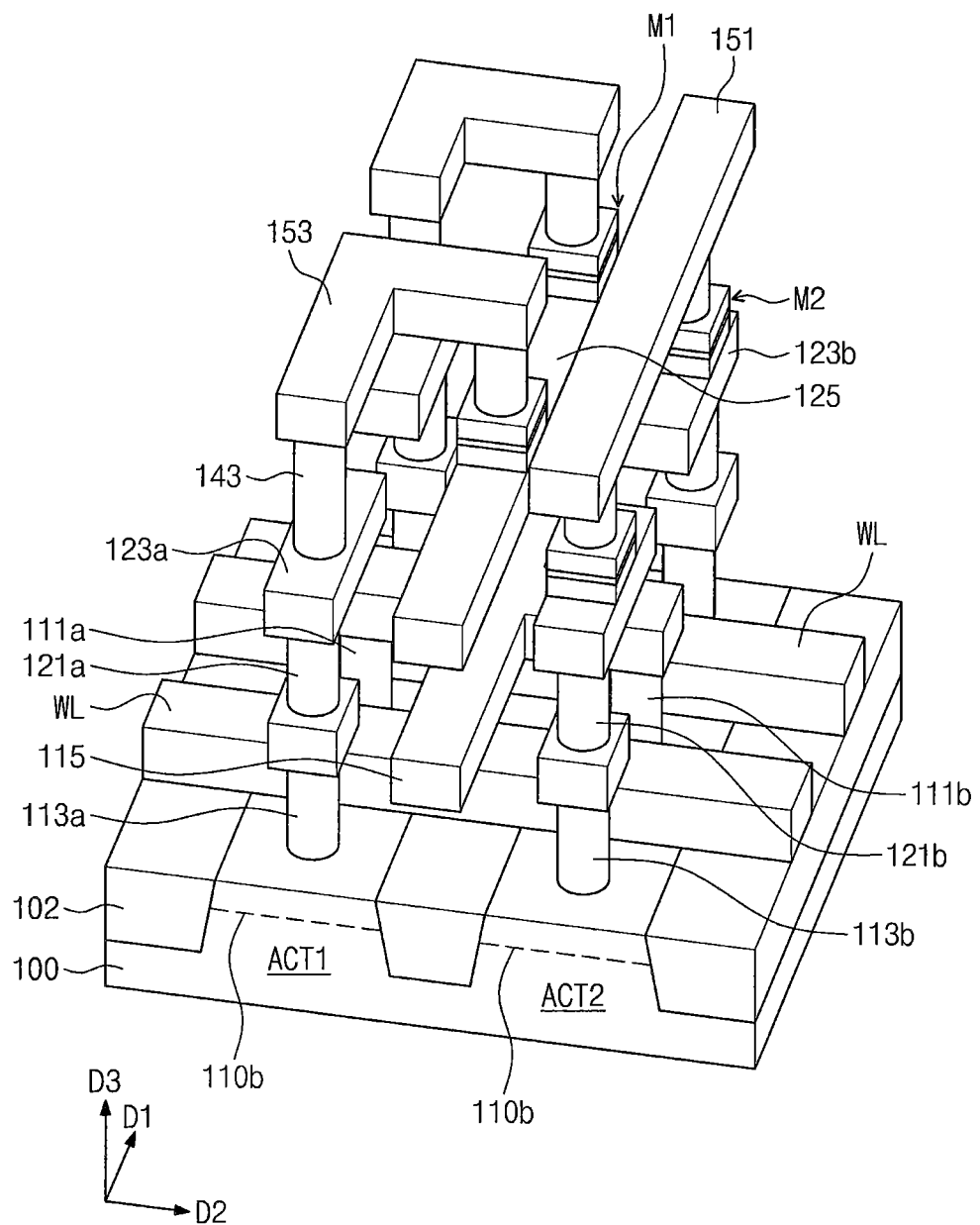
FIG. 15C is a perspective view illustrating a semiconductor memory device according to a first embodiment of the inventive concepts.

FIG. 15A is a plan view illustrating a semiconductor memory device according to some embodiments of the inventive concepts. FIG. 15B is a cross-sectional view taken along a line I-I' of FIG. 15A to illustrate a semiconductor memory device according to some embodiments of the inventive concepts. FIG. 15C is a perspective view illustrating a semiconductor memory device according to some embodiments of the inventive concepts.

Referring to FIGS. 15A, 15B, and 15C, a device isolation layer 102 may be formed in a semiconductor substrate 100 to define first and second active portions ACT1 and ACT2. The semiconductor substrate 100 may be a silicon substrate, a germanium substrate, or a silicon-germanium substrate.

In some embodiments, the first and second active portions ACT1 and ACT2 may have bar shapes including long axes that are parallel to a first direction D1. The first and second active portions ACT1 and ACT2 may be spaced apart from each other in a second direction D2 perpendicular to the first direction D1. The first and second active portions ACT1 and ACT2 may be two-dimensionally arranged along a plurality of rows and a plurality of columns. The first and second active portions ACT1 and ACT2 may be doped with dopants having a first conductivity type.

A pair of word lines WL that extend in the second direction D2 may be disposed on the semiconductor substrate 100 to intersect the first and second active portions ACT1 and ACT2. Each of the word lines WL may include a gate electrode 106 disposed on the semiconductor substrate 100, a gate dielectric layer 104 disposed between the gate electrode 106 and each of the first and second active portions ACT1 and ACT2, and a gate hard mask pattern 108 disposed on the gate electrode 106. The gate electrode 106 may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). The gate dielectric layer 104 may include at last one of an oxide (e.g., silicon oxide), a nitride (e.g., silicon nitride), an oxynitride (e.g., silicon oxynitride), or a high-k dielectric (e.g., an insulating metal oxide such as hafnium oxide and/or aluminum oxide). The gate hard mask pattern 108 may include at last one of an oxide (e.g., silicon oxide), a nitride (e.g., silicon nitride), or an oxynitride (e.g., silicon oxynitride).

According to some embodiments, a first dopant region 110a may be disposed in each of the first and second active portions ACT1 and ACT2 between the pair of word lines WL, and a pair of second dopant regions 110b may be respectively disposed in both edges of each of the first and second active portions ACT1 and ACT2 with the pair of word lines WL therebetween. The first and second dopant regions 110a and 110b may correspond to source/drain electrodes of a selection transistor. Thus, a pair of selection transistors formed at the first active portion ACT1 may share the first dopant region 110a formed in the first active portion ACT1, and a pair of selection transistors formed at the second active portion ACT2 may share the second dopant region 110b formed in the second active portion ACT2. The first and second dopant regions 110a and 110b may be doped with dopants of which a second conductivity type is different from the first conductivity type of the first and second active portions ACT1 and ACT2. One of the first conductivity type dopant and the second conductivity type dopant may be an N-type dopant, and the other thereof may be a P-type dopant.

A first interlayer insulating layer 110 may be disposed on an entire surface of the semiconductor substrate 100. For example, the first interlayer insulating layer 110 may be formed of at least one of a nitride (e.g., silicon nitride) and an oxynitride (e.g., silicon oxynitride).

A first source plug 111a may penetrate the first interlayer insulating layer 110 so as to be connected to the first dopant region 110a of the first active portion ACT1, and a second source plug 111b may penetrate the first interlayer insulating layer 110 so as to be connected to the first dopant region 110a of the second active portion ACT2.

First drain plugs 113a may penetrate the first interlayer insulating layer 110 so as to be respectively connected to the second dopant regions 110b disposed in the first active portion ACT1, and second drain plugs 113b may penetrate the first interlayer insulating layer 110 so as to be respectively connected to the second dopant regions 110b disposed in the second active portion ACT2.

In some embodiments, the first and second source plugs 111a and 111b and the first and second drain plugs 113a and 113b may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). In some embodiments, ohmic patterns (not shown) may be disposed between the contact plugs and the dopant regions 110a and 110b, respectively. The ohmic patterns may include a metal-semiconductor compound (e.g., a metal silicide such as cobalt silicide or titanium silicide).

A source line 115 may be disposed on the first interlayer insulating layer 110. The source line 115 may be connected in common to the first and second source plugs 111a and 111b. The source line 115 may extend in the first direction D1 to intersect or cross over the word lines WL. Portions of the source line 115 may protrude in the second direction D2 so as to be in contact with top surfaces of the first and second source plugs 111a and 111b, respectively. In addition, first conductive pads 117a and 117b may be disposed on the first interlayer insulating layer 110 and may be connected to the first and second drain plugs 113a and 113b, respectively.

A second interlayer insulating layer 120 may be disposed on the first interlayer insulating layer 110 and may cover the source line 115 and the first conductive pads 117a and 117b. The second interlayer insulating layer 120 may include at last one of an oxide (e.g., silicon oxide), a nitride (e.g., silicon nitride), or an oxynitride (e.g., silicon oxynitride).

First contact plugs 121a and 121b may penetrate the second interlayer insulating layer 120 so as to be connected to the first conductive pads 117a and 117b, respectively. Second conductive pads 123a and 123b may be disposed on the second interlayer insulating layer 120. The second conductive pads 123a and 123b may be electrically connected to the first conductive pads 117a and 117b through the first contact plugs 121a and 121b, respectively. In other words, the second conductive pads 123a and 123b may be electrically connected to the second dopant regions 110b of the first and second active portions ACT1 and ACT2, respectively. In addition, a lower bit line 125 that extends in the first direction D1 may be disposed on the second interlayer insulating layer 120. In some embodiments, the lower bit line 125 may be disposed between the second conductive pads 123a and 123b which are adjacent each other in the second direction D2. The lower bit line 125 may overlap with a portion of the source line 115 when viewed from a plan view.

A filling insulation layer 130 may fill spaces between the lower bit line 125 and the second conductive pads 123a and 123b on the second interlayer insulating layer 120. In some embodiments, the filling insulation layer 130 may expose top surfaces of the second conductive pads 123a and 123b and a top surface of the lower bit line 125.

According to some embodiments, first data storage patterns M1 may be disposed on the lower bit line 125 and may be electrically connected to the lower bit line 125. Second data storage patterns M2 may be respectively disposed on the second conductive pads 123b electrically connected to the second dopant regions 110b of the second active portion ACT2. In some embodiments, the first and second data storage patterns M1 and M2 may be disposed at the substantially same level in a vertical view. In other words, the first and second data storage patterns M1 and M2 may be disposed at the same height from a top surface of the semiconductor substrate 100. The first data storage patterns M1 may be spaced apart from each other in the first direction D1. When viewed from a plan view, the second data storage patterns M1 may be spaced apart from each other in the first direction D1 and may be respectively disposed at positions that are shifted from the first data storage patterns M1 in a diagonal direction with respect to the first and second directions D1 and D2.

The first and second data storage patterns M1 and M2 may have a variable resistance characteristic that is switchable between two resistance states by an electric pulse. In some embodiments, the first and second data storage patterns M1 and M2 may have a thin-layered structure that exhibits a magneto-resistance characteristic and may include at least one ferromagnetic material and/or at least one anti-ferromagnetic material.

In some embodiments, each of the first and second data storage patterns M1 and M2 may include a lower magnetic pattern LP, an upper magnetic pattern UP, and a tunnel barrier pattern TBP disposed between the lower and upper magnetic patterns LP and UP. Each of the first and second data storage patterns M1 and M2 may further include a bottom electrode BE and a top electrode TE. The lower magnetic pattern LP, the tunnel barrier pattern TBP, and the upper magnetic pattern LP may be disposed between the bottom electrode BE and the top electrode TE. In some embodiments, a stack structure of the first data storage pattern M1 may be the same as that of the second data storage pattern M2. For example, the lower magnetic patterns LP of the first and second data storage patterns M1 and M2 may be pinned layers having a fixed magnetization direction, and the upper magnetic patterns UP of the first and second data storage patterns M1 and M2 may be free layers having a magnetization direction that is changeable to be parallel or anti-parallel to the magnetization direction of the pinned layer. In some embodiments, the lower magnetic patterns LP may be the free layers, and the upper magnetic patterns UP may be the pinned layers.

In some embodiments, the first and second data storage patterns M1 and M2 including the magnetic materials may be formed by a patterning process. At this time, since the first data storage patterns M1 are disposed at the positions shifted from the second data storage patterns M2 in the diagonal direction with respect to the first and second directions D1 and D2 when viewed from a plan view, a process margin of the patterning process may be improved. In addition, a width of an upper portion of each of the first and second data storage patterns M1 and M2 may be smaller than that of a lower portion of each of the first and second data storage patterns M1 and M2. In this case, each of the first and second data storage patterns M1 and M2 may have a substantially trapezoidal cross-section. The first and second data storage patterns M1 and M2 will be described in more detail later.

A third interlayer insulating layer 140 may be disposed on the second interlayer insulating layer 120 and the filling insulating layer 130. In some embodiments, the third interlayer insulating layer 140 may fill a space between the first and second data storage patterns M1 and M2 and may cover top surfaces of the first and second data storage patterns M1 and M2. The third interlayer insulating layer 140 may be formed of at least one of an oxide (e.g., silicon oxide), a nitride (e.g., silicon nitride), or an oxynitride (e.g., silicon oxynitride).

Second contact plugs 141a and 141b may penetrate the third interlayer insulating layer 140 so as to be connected to the first and second data storage patterns M1 and M2, respectively. In addition, an interconnecting plug 143 may penetrate the third interlayer insulating layer 140 so as to be connected to each of the second conductive pads 123a electrically connected to the second dopant regions 110b of the first active portion ACT1.

An upper bit line 151 and interconnection patterns 153 may be disposed on the third interlayer insulating layer 140. The upper bit line 151 may extend in the first direction D1. The upper bit line 151 may be in contact with the second contact plugs 141b connected to the second data storage patterns M2. In other words, the upper bit line 151 may be electrically connected to the second data storage patterns M2, which are arranged along the first direction D1. Each of the interconnection patterns 153 may electrically connect the second contact plug 141a, which is connected to the first data storage pattern M1, to the interconnecting plug 143. In some embodiments, each of the interconnection patterns 153 may extend from the top surface of the first data storage pattern M1 onto a top surface of the interconnecting plug 143 adjacent the first data storage pattern M1. In other words, the interconnection pattern 153 and the interconnecting plug 143 may electrically connect the first data storage pattern M1 to the second conductive pad 123a, which is electrically connected to the second dopant region 110b of the first active portion ACT1.

In some embodiments, the upper bit line 151 may be disposed at a first height from the top surface of the semiconductor substrate 100, and the lower bit line 125 may be disposed at a second height from the top surface of the semiconductor substrate 100. Here, the first height may be different from the second height. In addition, the stack structure of the first data storage pattern M1 connected to the lower bit line 125 may be the same as the stack structure of the second data storage pattern M2 connected to the upper bit line 151, and the first and second data storage patterns M1 and M2 may be disposed at the same height from the top surface of the semiconductor substrate 100. Thus, directions of currents flowing through the first and second data storage patterns M1 and M2 may be opposite to each other when the semiconductor memory device is operated. In some embodiments, the source line 115 may be disposed to be lower than the lower bit line 125 in a vertical view.

Figure 16A:
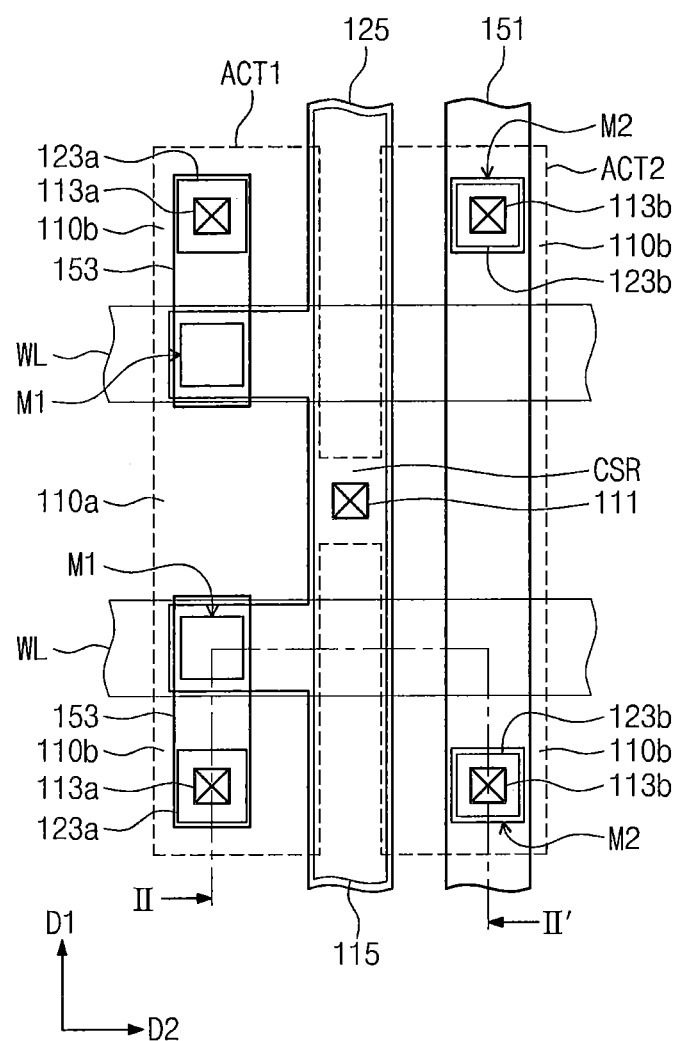
FIG. 16A is a plan view illustrating a semiconductor memory device according to a second embodiment of the inventive concepts.
Figure 16B:
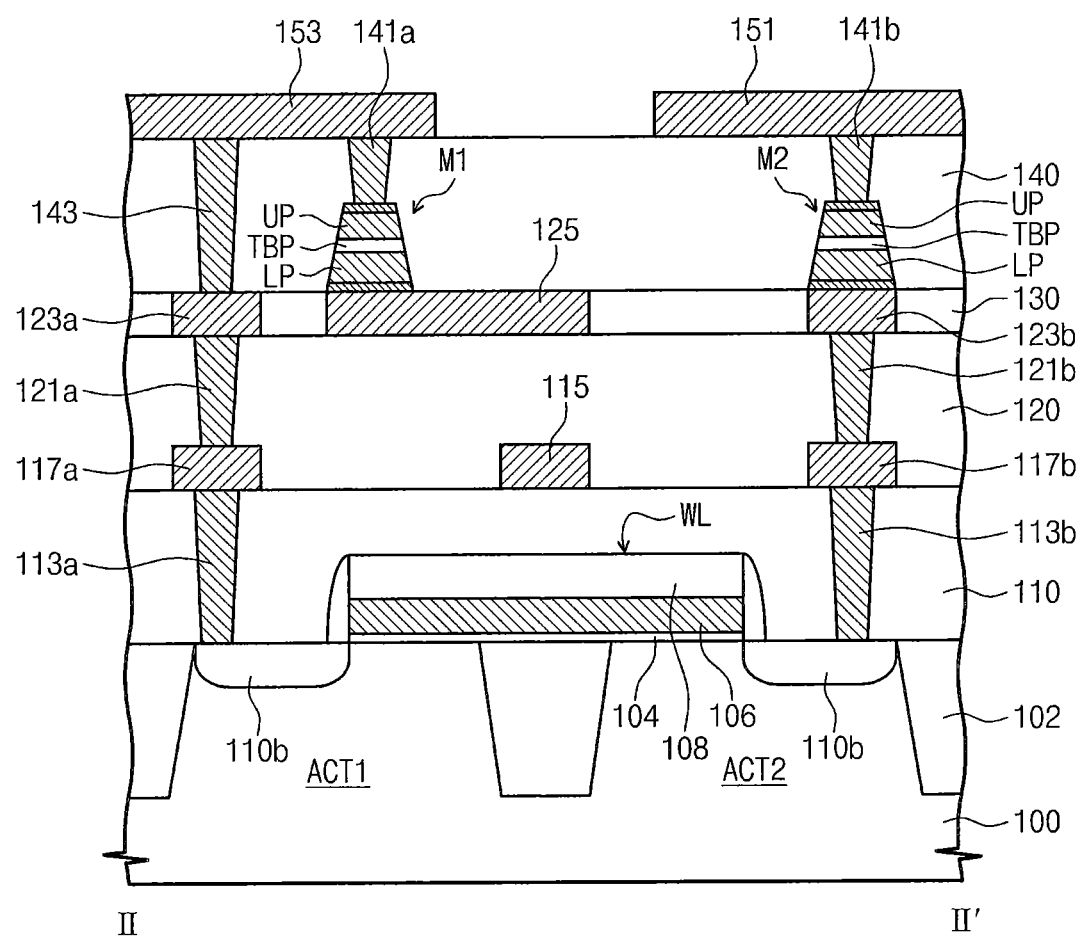
FIG. 16B is a cross-sectional view taken along a line II-II' of FIG. 16A to illustrate a semiconductor memory device according to a second embodiment of the inventive concepts.
Figure 16C:
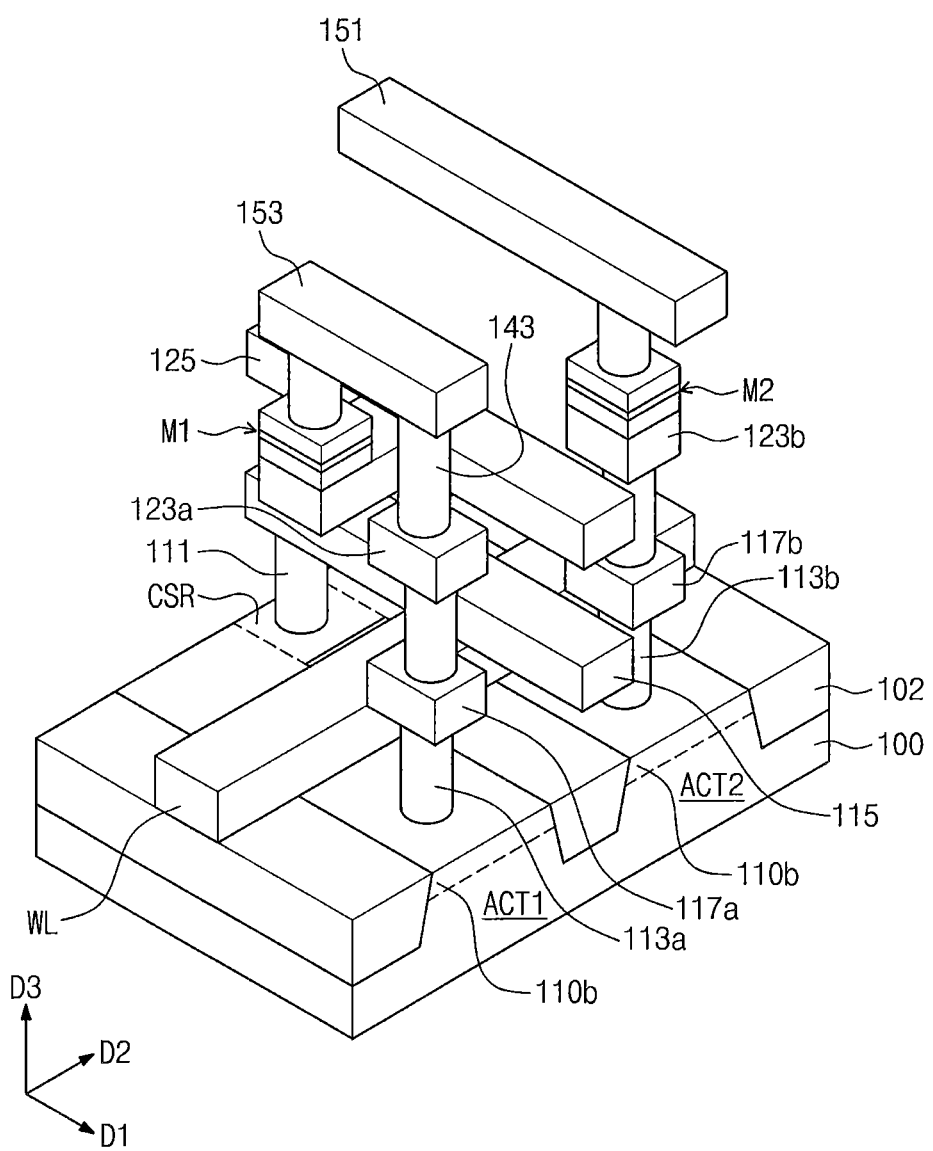
FIG. 16C is a perspective view illustrating a semiconductor memory device according to a second embodiment of the inventive concepts.

FIG. 16A is a plan view illustrating a semiconductor memory device according to some embodiments of the inventive concepts. FIG. 16B is a cross-sectional view taken along a line II-II' of FIG. 16A to illustrate a semiconductor memory device according to some embodiments of the inventive concepts. FIG. 16C is a perspective view illustrating a semiconductor memory device according to some embodiments of the inventive concepts.

Referring to FIGS. 16A, 16B, and 16C, a semiconductor substrate 100 may include first and active portions ACT1 and ACT2 and a common source portion CSR that are defined by a device isolation layer 102. The common source portion CSR may connect the first and second active portions ACT1 and ACT2 to each other.

The first and second active portions ACT1 and ACT2 may have bar shapes including long axes that are parallel to a first direction D1. The first and second active portions ACT1 and ACT2 may be spaced apart from each other in a second direction D2 perpendicular to the first direction D1. The common source portion CSR may be disposed between the first and second active portions ACT1 and ACT2. The first and second active portions ACT1 and ACT2 and the common source portion CSR may be doped with dopants having a first conductivity type.

A pair of word lines WL extending in the second direction D2 may be disposed on the semiconductor substrate 100 to intersect the first and second active portions ACT1 and ACT2. The common source portion CSR may be disposed between the word lines WL when viewed from a plan view. Each of the word lines WL may include a gate electrode 106 disposed on the semiconductor substrate 100, a gate dielectric layer 104 disposed between the gate electrode 106 and each of the first and second active portions ACT1 and ACT2, and a gate hard mask pattern 108 disposed on the gate electrode 106.

According to some embodiments, a first dopant region 110a may be formed in the first and second active portions ACT1 and ACT2 and the common source portion CSR which are disposed between the pair of word lines WL. A pair of second dopant regions 110b may be respectively disposed in both edges of each of the first and second active portions ACT1 and ACT2 with the pair of word lines WL therebetween. The first and second dopant regions 110a and 110b may correspond to source/drain electrodes of selection transistors. Thus, the first dopant region 110a may be shared by a pair of selection transistors formed at the first active portion ACT1 and a pair of selection transistors formed at the second active portion ACT2. The first and second dopant regions 110a and 110b may be doped with dopants of which a second conductivity type is different from the first conductivity type of the first and second active portions ACT1 and ACT2.

A first interlayer insulating layer 110 may be disposed on an entire surface of the semiconductor substrate 100. For example, the first interlayer insulating layer 110 may be formed of at least one of a nitride (e.g., silicon nitride) and an oxynitride (e.g., silicon oxynitride).

A common source plug 111 may penetrate the first interlayer insulating layer 110 so as to be connected to the first dopant region 110a of the common source portion CSR. First drain plugs 113a may penetrate the first interlayer insulating layer 110 so as to be respectively connected to the second dopant regions 110b disposed in the first active portion ACT1, and second drain plugs 113b may penetrate the first interlayer insulating layer 110 so as to be respectively connected to the second dopant regions 110b disposed in the second active portion ACT2.

A source line 115 and first conductive pads 117a and 117b may be disposed on the first interlayer insulating layer 110. The source line 115 may extend in the first direction D1 to intersect the word lines WL and may be electrically connected to the common source plug 111. The first conductive pads 117a and 117b may be connected to the first and second drain plugs 113a and 113b, respectively.

A second interlayer insulating layer 120 may be disposed on the first interlayer insulating layer 110 to cover the source line 115 and the first conductive pads 117a and 117b. First contact plugs 121a and 121b may penetrate the second interlayer insulating layer 120 so as to be connected to the first conductive pads 117a and 117b, respectively.

Second conductive pads 123a and 123b and a lower bit line 125 may be disposed on the second interlayer insulating layer 120. The second conductive pads 123a and 123b may be connected to the first contact plugs 121a and 121b, respectively. In other words, the second conductive pads 123a and 123b may be electrically connected to the second dopant regions 110b of the first and second active portions ACT1 and ACT2, respectively. The lower bit line 125 may extend in the first direction D1 on the second interlayer insulating layer 120 and may be disposed between the second conductive pads 123a and 123b. The lower bit line 125 may overlap with a portion of the source line 115 when viewed from a plan view. In some embodiments, the lower bit line 125 may have protrusions that extend onto the first active portion ACT1 along the second direction D2.

A filling insulation layer 130 may fill spaces between the lower bit line 125 and the second conductive pads 123a and 123b on the second interlayer insulating layer 120. In some embodiments, the filling insulation layer 130 may expose top surfaces of the second conductive pads 123a and 123b and a top surface of the lower bit line 125.

According to some embodiments, first data storage patterns M1 may be disposed on the protrusions of the lower bit line 125, respectively. The first data storage patterns M1 may be electrically connected to the lower bit line 125. The first data storage patterns M1 may be spaced apart from each other along the first direction D1. Second data storage patterns M2 may be disposed on the second conductive pads 123b electrically connected to the second dopant regions 110b of the second active portion ACT2, respectively. When viewed from a plan view, the second data storage patterns M1 may be spaced apart from each other in the first direction D1 and may be respectively disposed at positions that are shifted from the first data storage patterns M1 along a diagonal direction with respect to the first and second directions D1 and D2.

According to some embodiments, the first and second data storage patterns M1 and M2 may be disposed at the same height from the top surface of the semiconductor substrate 100. As described above, each of the first and second data storage patterns M1 and M2 may include the lower magnetic pattern LP, the upper magnetic pattern UP, and the tunnel barrier pattern TBP therebetween and may have the same stack structure.

A third interlayer insulating layer 140 may be disposed on the filling insulation layer 130. In some embodiments, the third interlayer insulating layer 140 may fill a space between the first and second data storage patterns M1 and M2 and may cover top surfaces of the first and second data storage patterns M1 and M2.

Second contact plugs 141a and 141b may penetrate the third interlayer insulating layer 140 so as to be connected to the first and second data storage patterns M1 and M2, respectively. In addition, an interconnecting plug 143 may penetrate the third interlayer insulating layer 140 so as to be connected to each of the second conductive pads 123a electrically connected to the second dopant regions 110b of the first active portion ACT1.

An upper bit line 151 extending in the first direction D1 and interconnection patterns 153 may be disposed on the third interlayer insulating layer 140. The upper bit line 151 may be electrically connected to the second data storage patterns M2 arranged in the first direction D1 through the second contact plugs 141b. Each of the interconnection patterns 153 may electrically connect the second contact plug 141a, which is connected to the first data storage pattern M1, to the interconnecting plug 143. In some embodiments, the interconnection patterns 153 may have bar shapes extending in the first direction D1. In other words, the interconnection pattern 153 and the interconnecting plug 143 may electrically connect the first data storage pattern M1 to the second conductive pad 123a electrically connected to the second dopant region 110b of the first active portion ACT1.

Figure 17A:
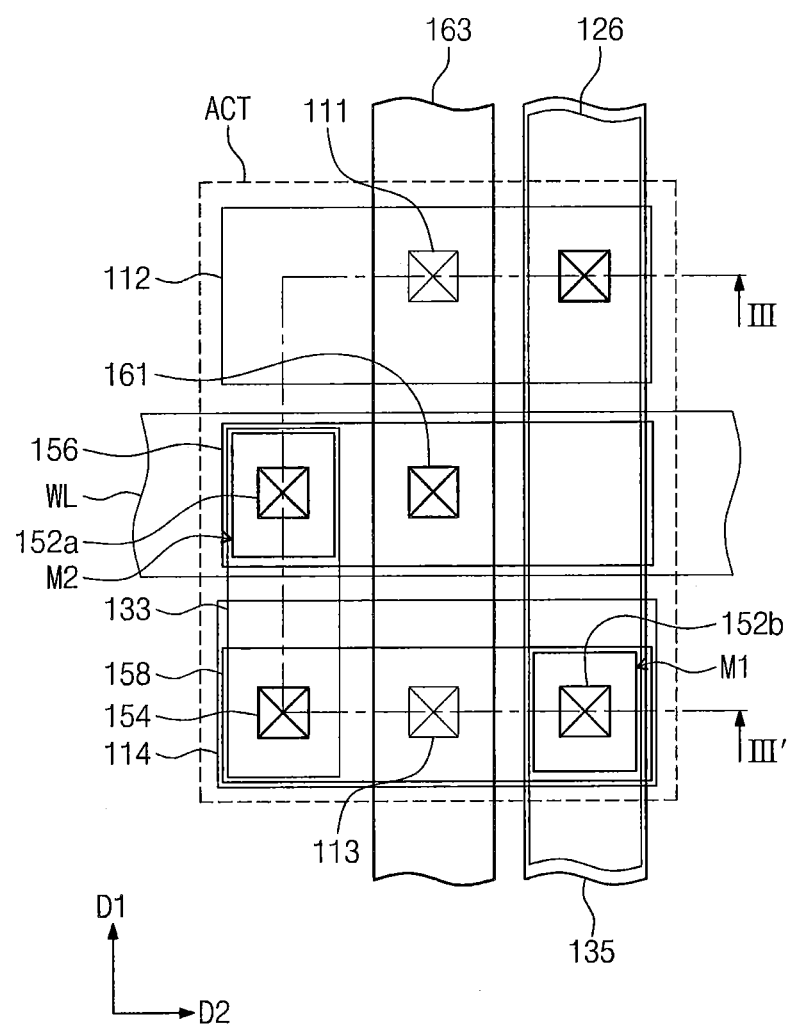
FIG. 17A is a plan view illustrating a semiconductor memory device according to a third embodiment of the inventive concepts.
Figure 17B:
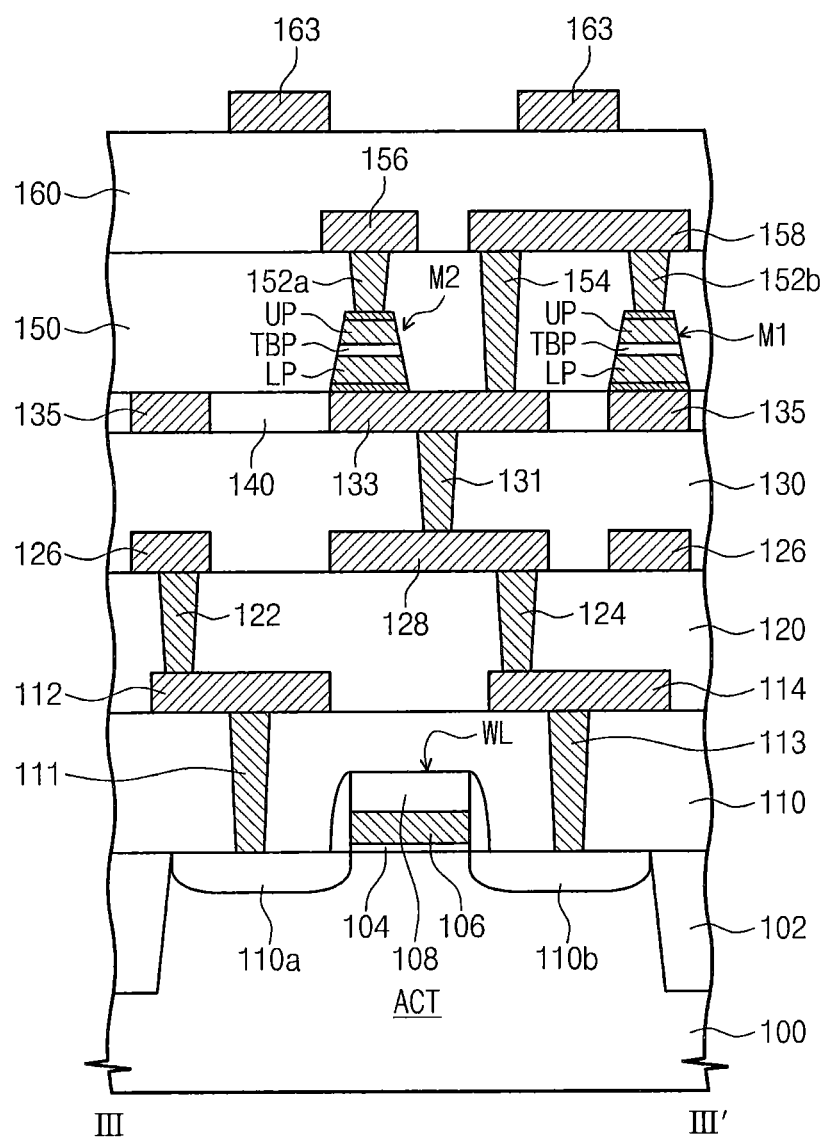
FIG. 17B is a cross-sectional view taken along a line III-III' of FIG. 17A to illustrate a semiconductor memory device according to a third embodiment of the inventive concepts.
Figure 17C:
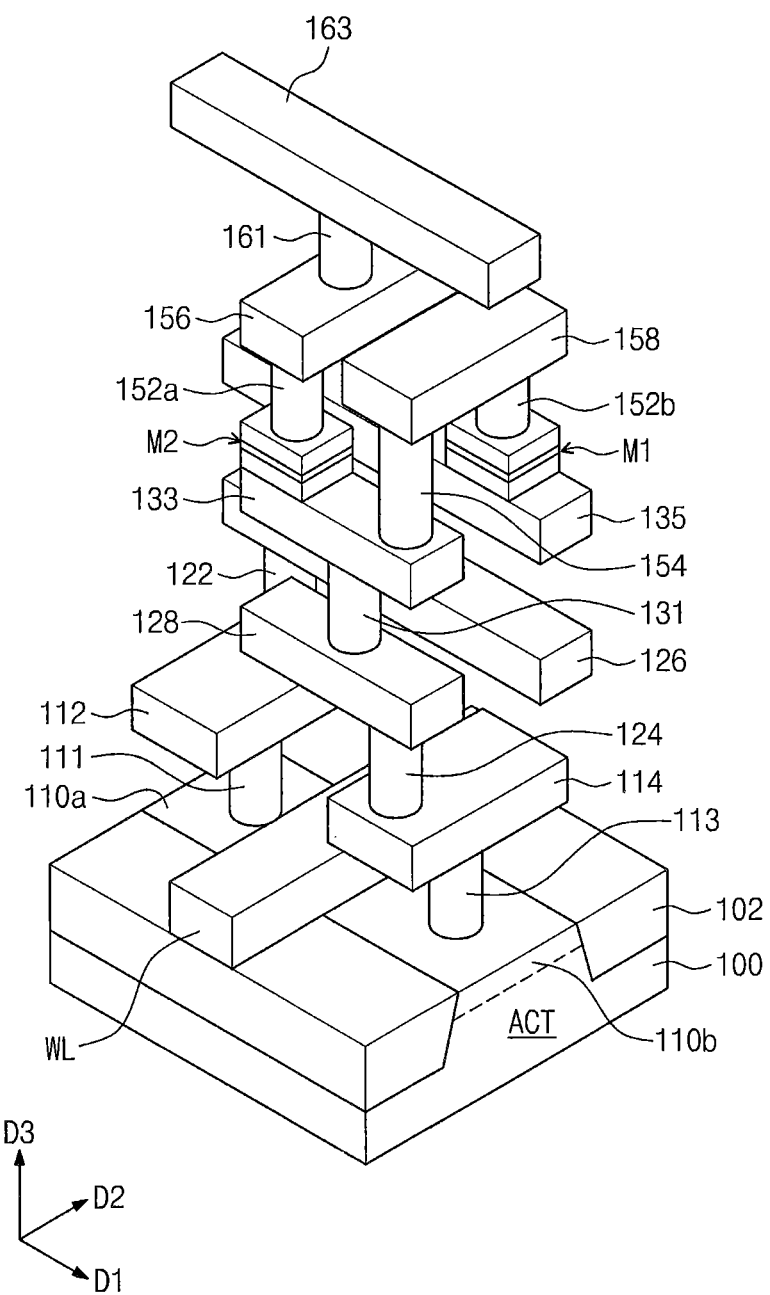
FIG. 17C is a perspective view illustrating a semiconductor memory device according to a third embodiment of the inventive concepts.

FIG. 17A is a plan view illustrating a semiconductor memory device according to some embodiments of the inventive concepts. FIG. 17B is a cross-sectional view taken along a line III-III' of FIG. 17A to illustrate a semiconductor memory device according to some embodiments of the inventive concepts. FIG. 17C is a perspective view illustrating a semiconductor memory device according to some embodiments of the inventive concepts.

Referring to FIGS. 17A, 1713, 17C, a semiconductor substrate 100 may include an active portion ACT defined by a device isolation layer 102. The active portion ACT may have a bar shape including a long axis that is parallel to a first direction D1. The active portion ACT may be doped with dopants having a first conductivity type.

A word line WL may extend in a second direction D2 to intersect the active portion ACT on the semiconductor substrate 100. The word line WL may include a gate electrode 106 disposed on the semiconductor substrate 100, a gate dielectric layer 104 disposed between the gate electrode 106 and the active portion ACT, and a gate hard mask pattern 108 disposed on the gate electrode 106.

According to some embodiments, a first dopant region 110a may be formed in the active portion ACT at one side of the word line WL, and a second dopant region 110b may be disposed in the active portion ACT at another side of the word line WL. The first and second dopant regions 110a and 110b may be doped with dopants of which a second conductivity type is different from the first conductivity type of the active portion ACT.

A first interlayer insulating layer 110 may be disposed on an entire surface of the semiconductor substrate 100. For example, the first interlayer insulating layer 110 may be formed of at least one of a nitride (e.g., silicon nitride) and an oxynitride (e.g., silicon oxynitride).

According to some embodiments, a source plug 111 may penetrate the first interlayer insulating layer 110 so as to be connected to the first dopant region 110a, and a drain plug 113 may penetrate the first interlayer insulating layer 110 so as to be connected to the second dopant region 110b. A source pad 112 and a drain pad 114 may be disposed on the first interlayer insulating layer 110. The source pad 112 may be connected to the source plug 111 and the drain pad 114 may be connected to the drain plug 113.

A second interlayer insulating layer 120 may be disposed on the first interlayer insulating layer 110 to cover the source and drain pads 112 and 114. According to some embodiments, a source line 126 extending in the first direction D1 may be disposed on the second interlayer insulating layer 120. The source line 126 may be electrically connected to the source pad 112 through a first contact plug 122. A first conductive pad 128 may be disposed on the second interlayer insulating layer 120. The first conductive pad 128 may be laterally spaced apart from the source line 126. The first conductive pad 128 may be electrically connected to the drain pad 114 through a second contact plug 124.

A third interlayer insulating layer 130 may be disposed on the second interlayer insulating layer 120 to cover the source line 126 and the first conductive pad 128. A lower bit line 135 and a second conductive pad 133 may be disposed on the third interlayer insulating layer 130. The lower bit line 135 may extend in the first direction D1 and may overlap with a portion of the source line 126 when viewed from a plan view. The second conductive pad 133 may have a bar shape extending in the first direction D1 and may be laterally spaced apart from the lower bit line 135. The second conductive pad 133 may be electrically connected to the first conductive pad 128 through a third contact plug 131.

A filling insulation layer 140 may fill a space between the second conductive pad 133 and the lower bit line 135 on the third interlayer insulating layer 130. In some embodiments, the filling insulation layer 140 may expose top surfaces of the second conductive pad 133 and the lower bit line 135.

According to the present embodiment, a first data storage pattern M1 may be disposed on the lower bit line 135 and may be electrically connected to the lower bit line 135. A second data storage pattern M2 may be disposed on the second conductive pad 133 and may be disposed at a position which is shifted from the first data storage pattern M1 in a diagonal direction with respect to the first and second directions D1 and D2. According to the some embodiments, the first and second data storage patterns M1 and M2 may be disposed at the same height from the top surface of the semiconductor substrate 100. Each of the first and second data storage patterns M1 and M2 may include the lower magnetic pattern LP, the upper magnetic pattern UP, and the tunnel barrier pattern TBP therebetween, as described above. In addition, the first and second data storage patterns M1 and M2 may have the same stack structure, as described with reference to FIGS. 15A to 15C.

A fourth interlayer insulating layer 150 may be disposed on the filling insulation layer 140. In some embodiments, the fourth interlayer insulating layer 150 may fill a space between the first and second data storage patterns M1 and M2 and may cover top surfaces of the first and second data storage patterns M1 and M2.

According to some embodiments, the second conductive pad 133 electrically connected to the second dopant region 110b may be electrically connected in common to the first and second data storage patterns M1 and M2. In more detail, the second conductive pad 133 may be electrically connected to the lower magnetic pattern LP of the second data storage pattern M2 and may be electrically connected to the upper magnetic pattern UP of the first data storage pattern M1 through an interconnecting plug 154 and an interconnection pattern 158. The interconnecting plug 154 may penetrate the fourth interlayer insulating layer 150 may be connected to the second conductive pad 133. The interconnection pattern 158 may be disposed on the fourth interlayer insulating layer 150 and may be connected to the first data storage pattern M1 through a fourth contact plug 152b. In addition, a third conductive pattern 156 may be disposed to be laterally spaced apart from the interconnection pattern 158 on the fourth interlayer insulating layer 150. The third conductive pad 156 may be connected to the second data storage pattern M2 through a fifth contact plug 152a.

A fifth interlayer insulating layer 160 may be disposed on the fourth interlayer insulating layer 150 to cover the interconnection pattern 158 and the third conductive pad 156. An upper bit line 163 may extend in the first direction D1 on the fifth interlayer insulating layer 160. The upper bit line 163 may be electrically connected to the third conductive pad 156 through a sixth contact plug 161. In other words, in some embodiments, the upper bit line 163 may be electrically connected to the second data storage pattern M2 through the sixth contact plug 161 and the third conductive pad 156.

According to some embodiments, the first and second data storage patterns M1 and M2, which have the same stack structure and are disposed at the same height from the top surface of the semiconductor substrate 100, may be electrically connected in common to the second dopant region 110b. In addition, the lower and upper bit lines 135 and 163 may be disposed at different heights from the top surface of the semiconductor substrate 100. Thus, directions of currents flowing through the first and second data storage patterns M1 and M2 may be opposite to each other when the semiconductor memory device is operated.

Figure 18A:
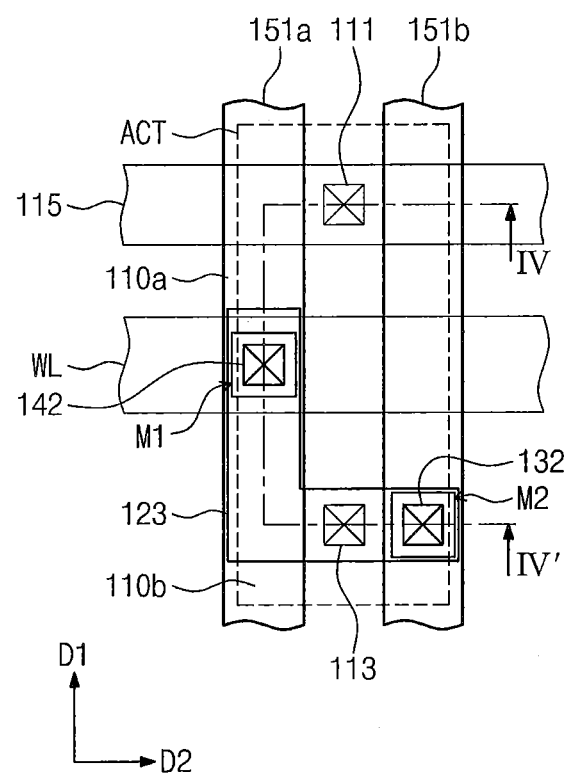
FIG. 18A is a plan view illustrating a semiconductor memory device according to a fourth embodiment of the inventive concepts.
Figure 18B:
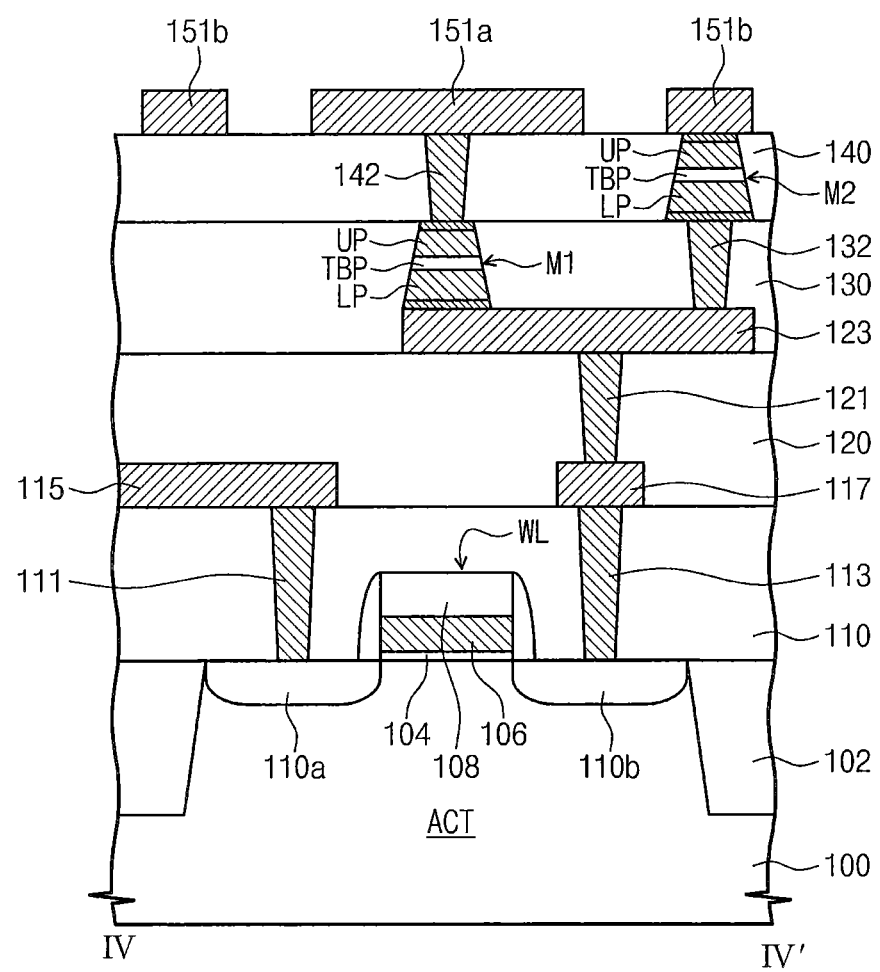
FIG. 18B is a cross-sectional view taken along a line IV-IV' of FIG. 18A to illustrate a semiconductor memory device according to a fourth embodiment of the inventive concepts.
Figure 18C:
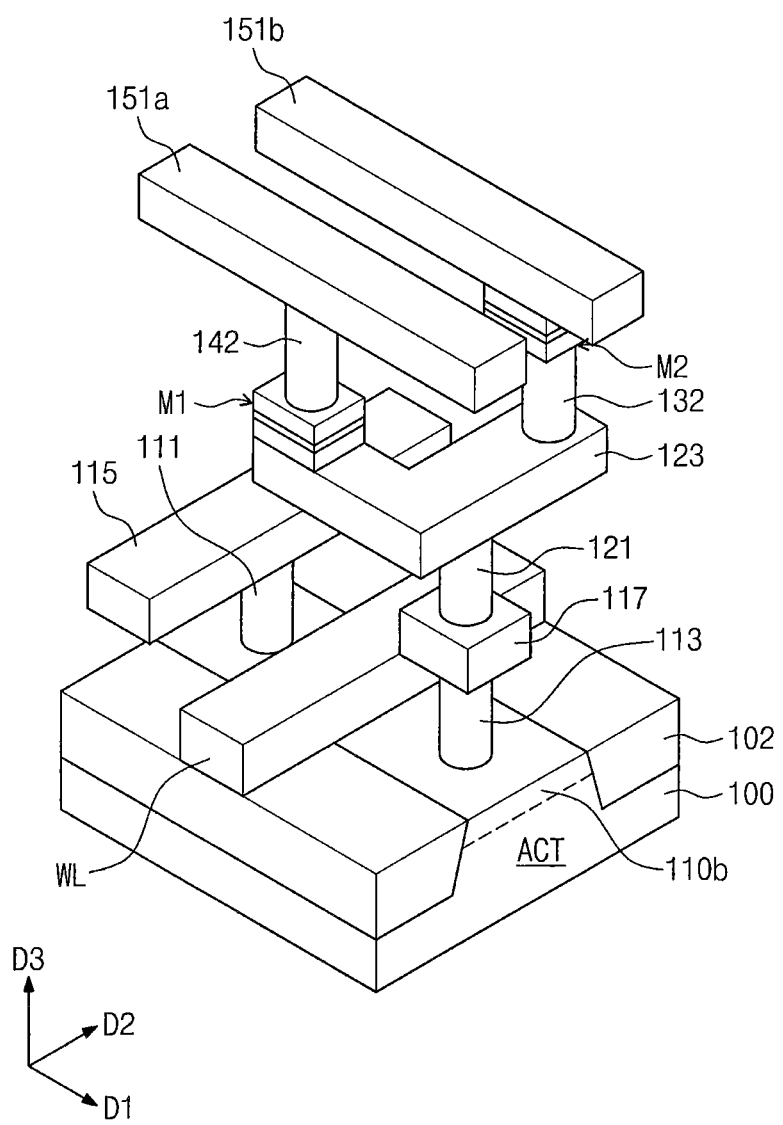
FIG. 18C is a perspective view illustrating a semiconductor memory device according to a fourth embodiment of the inventive concepts.

FIG. 18A is a plan view illustrating a semiconductor memory device according to some embodiments of the inventive concepts. FIG. 18B is a cross-sectional view taken along a line IV-IV' of FIG. 18A to illustrate a semiconductor memory device according to some embodiments of the inventive concepts. FIG. 18C is a perspective view illustrating a semiconductor memory device illustrated in FIGS. 18A and 18B according to some embodiments of the inventive concepts.

Referring to FIGS. 18A, 18B, and 18C, a semiconductor substrate 100 may include an active portion ACT defined by a device isolation layer 102. The active portion ACT may have a bar shape that includes a long axis that is parallel to a first direction D1. The active portion ACT may be doped with dopants having a first conductivity type.

A word line WL may extend in a second direction D2 to intersect the active portion ACT on the semiconductor substrate 100. The word line WL may include a gate electrode 106 disposed on the semiconductor substrate 100, a gate dielectric layer 104 disposed between the gate electrode 106 and the active portion ACT, and a gate hard mask pattern 108 disposed on the gate electrode 106.

In some embodiments, a first dopant region 110a may be formed in the active portion ACT at one side of the word line WL, and a second dopant region 110b may be formed in the active portion ACT at another side of the word line WL. The first and second dopant regions 110a and 110b may be doped with dopants of which a second conductivity type is different from the first conductivity type of the active portion ACT.

A first interlayer insulating layer 110 may be disposed on an entire surface of the semiconductor substrate 100. A source line 115 and a drain pad 117 may be disposed on the first interlayer insulating layer 110. The source line 115 may be electrically connected to the first dopant region 110a through a source plug 111 penetrating the first interlayer insulating layer 110. The drain pad 117 may be electrically connected to the second dopant region 110b through a drain plug 113 penetrating the first interlayer insulating layer 110.

A second interlayer insulating layer 120 may be disposed on the first interlayer insulating layer 110 to cover the source line 115 and the drain pad 117. An interconnection pattern 123 may be disposed on the second interlayer insulating layer 120. The interconnection pattern 123 may be electrically connected to the drain pad 117 through a first contact plug 121 penetrating the second interlayer insulating layer 120. According to some embodiments, the interconnection pattern 123 may have a portion extending in the first direction D1 and a portion extending in the second direction D2. In some embodiments, the interconnection pattern 123 may have a bar shape extending in the second direction D2.

According to some embodiments, a first data storage pattern M1 and a second data storage pattern M2 may be electrically connected in common to the second dopant region 110b and may be disposed at different heights from the top surface of the semiconductor substrate 100. The first data storage pattern M1 may be in direct contact with a top surface of the interconnection pattern 123, and the second data storage pattern M2 may be connected to the interconnection pattern 123 through a second contact plug 132.

The first data storage pattern M1 may include a lower magnetic pattern LP, an upper magnetic pattern UP, and a tunnel barrier pattern TBP disposed therebetween. In addition, the first data storage pattern M1 may further include a bottom electrode and a top electrode. The lower magnetic pattern LP, the tunnel barrier pattern TBP, and the upper magnetic pattern UP may be disposed between the bottom electrode and the top electrode in the first data storage pattern M1. Here, the lower magnetic pattern LP of the first data storage pattern M1 may be a pinned layer having a fixed magnetization direction, and the upper magnetic pattern UP of the first data storage pattern M1 may be a free layer having a magnetization direction which is changeable to be parallel to or anti-parallel to the magnetization direction of the pinned layer.

The second data storage pattern M2 may be disposed on a third interlayer insulating layer 130 and may be in contact with the second contact plug 132. Here, the second data storage pattern M2 may include a lower magnetic pattern LP, an upper magnetic pattern UP, and a tunnel barrier pattern TBP disposed therebetween. In addition, the second data storage pattern M2 may further include a bottom electrode and a top electrode. The lower magnetic pattern LP, the tunnel barrier pattern TBP, and the upper magnetic pattern UP may be disposed between the bottom electrode and the top electrode in the second data storage pattern M2. The lower magnetic pattern LP of the first data storage pattern M1 may be a free layer having a changeable magnetization direction, and the upper magnetic pattern UP of the first data storage pattern M1 may be a pinned layer having a fixed magnetization direction.

A fourth interlayer insulating layer 140 may be disposed on the third interlayer insulating layer 130, and first and second bit lines 151a and 151b may extend in parallel along the first direction D1 on the fourth interlayer insulating layer 140. In other words, the first and second bit lines 151a and 151b may be disposed at the same height from the top surface of the semiconductor substrate 100 in some embodiments. The first bit line 151a may be connected to the first data storage pattern M1 through a third contact plug 142, and the second bit line 151b may be in contact with a top surface of the second data storage pattern M2.

According to some embodiments, the first bit line 151 a connected to the first data storage pattern M1 and the second bit line 151b connected to the second data storage pattern M1 may be disposed at the same height from the top surface of the semiconductor substrate 100. In addition, the first and second data storage patterns M1 and M2 may be disposed at different heights from each other and may have different stack structures from each other. Thus, directions of currents flowing through the first and second data storage patterns M1 and M2 may be opposite to each other when the semiconductor memory device is operated.

FIGS. 19A to 19F are cross-sectional views illustrating data storage patterns of semiconductor memory devices according to some embodiments of the inventive concepts. Referring to FIGS. 19A to 19E, a data storage pattern DSP may include a pinned layer, a free layer, and a tunnel barrier layer disposed therebetween. In addition, the data storage pattern DSP may further include a bottom electrode BE and a top electrode TE. The pinned layer, the tunnel barrier layer, and the free layer may be disposed between the bottom electrode BE and the top electrode TE.

Figure 19A:
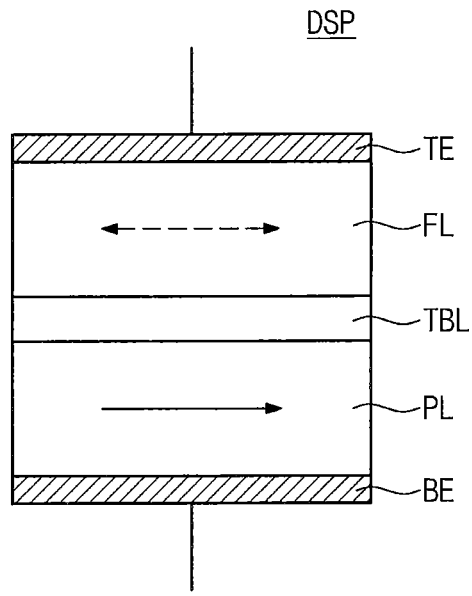
FIGS. 19A to 19F are cross-sectional views illustrating data storage patterns of semiconductor memory devices according to example embodiments of the inventive concepts.
Figure 19B:
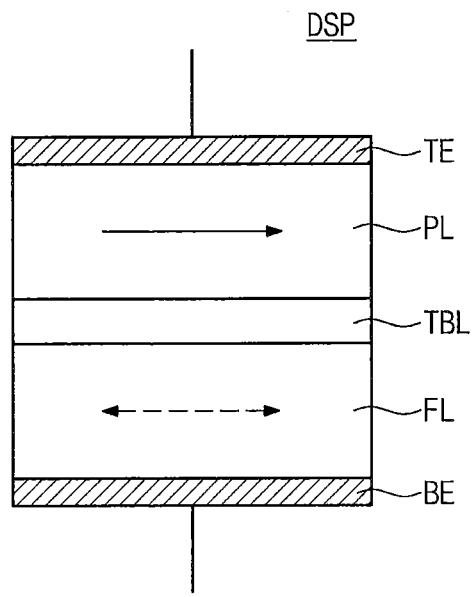

As illustrated in FIG. 19A, the pinned layer PL may be disposed between the bottom electrode BE and the tunnel barrier layer TBL and the free layer FL may be disposed between the top electrode TE and the tunnel barrier layer TBL. In some embodiments, as illustrated in FIG. 19B, the free layer FL may be disposed between the bottom electrode BE and the tunnel barrier layer TBL and the pinned layer PL may be disposed between the top electrode TE and the tunnel barrier layer TBL. Referring to FIGS. 19A and 19B, the magnetization directions of the pinned layer PL and the free layer FL may be parallel to a top surface of the tunnel barrier layer TBL.

Each of the pinned layer PL and the free layer FL may include a ferromagnetic material. The pinned layer PL may further include an anti-ferromagnetic material pinning a magnetization direction of the ferromagnetic material included in the pinned layer PL. The tunnel barrier layer TBL may include at least one of magnesium oxide, titanium oxide, aluminum oxide, magnesium-zinc oxide, or magnesium-boron oxide. Each of the bottom and top electrodes BE and TE may include a conductive metal nitride (e.g., titanium nitride, tantalum nitride, and/or tungsten nitride).

Figure 19C:
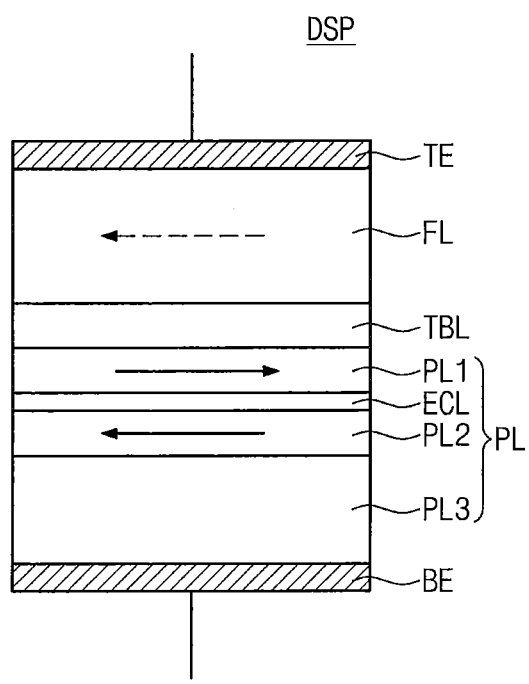

According to some embodiments illustrated in FIG. 19C, a pinned layer PL of a data storage pattern DSP may include a first pinned layer PL1, an exchange coupling layer ECL, a second pinned layer PL2, and a pinning layer PL3. The pinning layer PL3, the second pinned layer PL2, the exchange coupling layer ECL, and the first pinned layer PL1 may be sequentially stacked on the bottom electrode BE.

The first pinned layer PL1 may be in direct contact with the tunnel barrier layer TBL, and the second pinned layer PL2 may be in direct contact with the pinning layer PL3. The second pinned layer PL2 may have a magnetization direction that is fixed in one direction by the pinning layer PL3. A magnetization direction of the first pinned layer PL1 may be fixed to be anti-parallel to the magnetization direction of the second pinned layer PL2 by the exchange coupling layer ECL.

The first pinned layer PL1 may include a ferromagnetic material. For example, the first pinned layer PL1 may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). The second pinned layer PL2 may include a magnetic material including iron (Fe). For example, the magnetic material of the second pinned layer PL2 may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi). A content of terbium (Tb) may be smaller than about 10% in cobalt-iron-terbium (CoFeTb), so the first or second pinned layer PL1 or PL2 may have the magnetization direction parallel to the top surface of the tunnel barrier layer TBL. Likewise, a content of gadolinium (Gd) may be smaller than about 10% in cobalt-iron-gadolinium (CoFeGd), so the first or second pinned layer PL1 or PL2 may have the magnetization direction parallel to the top surface of the tunnel barrier layer TBL.

The exchange coupling layer ECL may include a rare metal. For example, the exchange coupling layer ECL may include at least one of ruthenium (Ru), iridium (Ir), and/or rhodium (Rh).

The pinning layer PL3 may include anti-ferromagnetic material. For example, the pinning layer PL3 may include at least one of platinum-manganese (PtMn), iridium-manganese (IrMn), manganese oxide (MnO), manganese sulfide (MnS), manganese-tellurium (MnTe), and/or manganese fluoride (MnF).

Figure 19D:
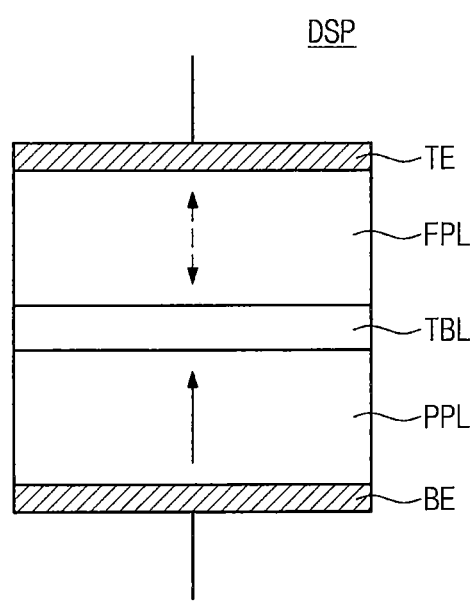
Figure 19E:
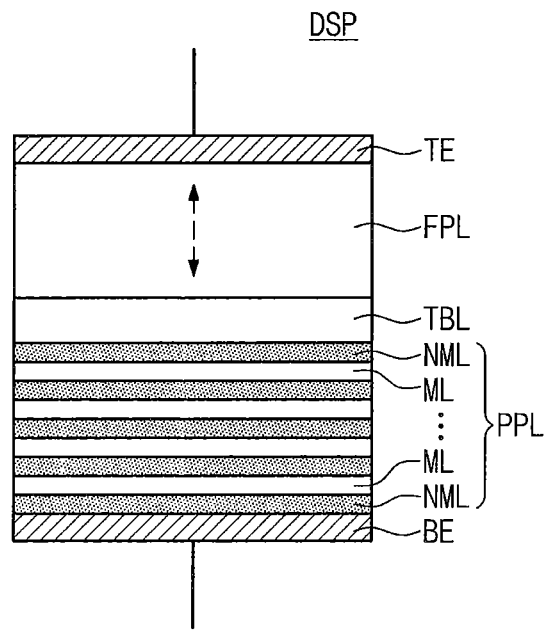

According to some embodiments as illustrated in FIGS. 19D and 19E, a data storage pattern DSP may include a pinned perpendicular magnetic layer PPL, a free perpendicular magnetic layer FPL, and a tunnel barrier layer TBL disposed therebetween. The pinned perpendicular magnetic layer PPL may have a magnetization direction fixed in one direction, and the free perpendicular magnetic layer FPL may have a magnetization direction that is changeable to be parallel or anti-parallel to the magnetization direction of the pinned perpendicular magnetic layer PPL. The magnetization directions of the pinned perpendicular magnetic layer PPL and the free perpendicular magnetic layer FPL may be substantially perpendicular to a top surface of the tunnel barrier layer TBL. The pinned perpendicular magnetic layer PPL, the tunnel barrier layer TBL, and the free perpendicular magnetic layer FPL may be sequentially stacked between the bottom electrode BE and the top electrode TE. Some embodiments provide that the free perpendicular magnetic layer FPL, the tunnel barrier layer TBL, and the pinned perpendicular magnetic layer PPL may be sequentially stacked between the bottom electrode BE and the top electrode TE.

In the data storage pattern DSP illustrated in FIG. 19D, each of the pinned perpendicular magnetic layer PPL and the free perpendicular magnetic layer FPL may include a perpendicular magnetic material (e.g., CoFeTb, CoFeGd, or CoFeDy), a perpendicular magnetic material having a $L1_0$ structure, or cobalt-platinum (CoPt) having a hexagonal close packed lattice structure. Here, the perpendicular magnetic material having the $L1_0$ structure may include at least one of iron-platinum (FePt) having the $L1_0$ structure, iron-palladium (FePd) having the $L1_0$ structure, cobalt-palladium (CoPd) having the $L1_0$ structure, or cobalt-platinum (CoPt) having the $L1_0$ structure. Here, the pinned perpendicular magnetic layer PPL may be thicker than the free perpendicular magnetic layer FPL and/or a coercive force of the pinned perpendicular magnetic layer PPL may be greater than that of the free perpendicular magnetic layer FPL. The tunnel barrier layer TBL may include at least one of magnesium oxide, titanium oxide, aluminum oxide, magnesium-zinc oxide, or magnesium-boron oxide.

According to some embodiments as illustrated in FIG. 19E, a pinned perpendicular magnetic layer PPL of the data storage pattern DSP may include one or more magnetic layers ML and one or more non-magnetic layers NML that are alternately stacked.

The magnetic layers ML may be formed of a ferromagnetic material and the non-magnetic layers NML may be formed of a metal oxide. For example, each of the magnetic layers ML may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chrome (CoFeCr), cobalt-iron-terbium (CoFeTb), cobalt-iron-gadolinium (CoFeGd), and/or cobalt-iron-nickel (CoFeNi).

The non-magnetic layers NML may be in direct contact with the magnetic layers ML. Magnetization directions of the magnetic layers ML may be changed to be parallel to a thickness direction of the magnetic layer ML (i.e., a normal line direction of a main surface of the magnetic layer ML) by the direct contact between the non-magnetic layers NML and the magnetic layers ML. In other words, the non-magnetic layers NML may provide an external factor that changes an intrinsic horizontal magnetization characteristic of the magnetic layers ML into a perpendicular magnetization characteristic. For example, the non-magnetic layers NML may include at least one of magnesium oxide, tantalum oxide, titanium oxide, aluminum oxide, magnesium-zinc oxide, hafnium oxide, and/or magnesium-boron oxide. In some embodiments, a resistivity value of the non-magnetic layers NML may be higher than that of the magnetic layers ML. Some embodiments provide that the non-magnetic layers NML may be thinner than the magnetic layers ML.

An uppermost one of the non-magnetic layers NML may be in direct contact with the tunnel barrier layer TBL. In some embodiments, a perpendicular magnetization preservation pattern (not shown) may be disposed between the tunnel barrier layer TBL and the uppermost one of the non-magnetic layers NML. The perpendicular magnetization preservation pattern (not shown) may be formed of a material of which a resistivity value is lower than that of the non-magnetic layers NML. For example, the perpendicular magnetization preservation pattern (not shown) may be formed of at least one of a noble metal (e.g., ruthenium, rhodium, palladium, silver, osmium, iridium, platinum, and/or gold) and copper.

Figure 19F:
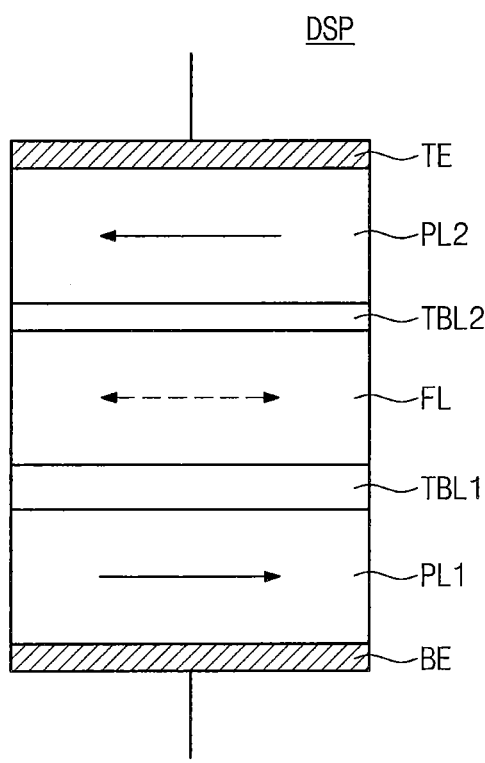

According to some embodiments as illustrated in FIG. 19F, a data storage pattern DSP may include a first pinned layer PL1, a first tunnel barrier layer TBL1, a free layer FL, a second tunnel barrier layer TBL2, and a second pinned layer PL2 which are sequentially stacked. A thickness of the first tunnel barrier layer TBL1 may be different from that of the second tunnel barrier layer TBL2. In the data storage pattern DSP, the first pinned layer PL1, the first tunnel barrier layer TBL1, and the free layer FL may constitute a first magnetic tunnel junction. In addition, the free layer FL, the second tunnel barrier layer TBL2, and the second pinned layer PL2 may constitute a second magnetic tunnel junction.

The first and second pinned layers PL1 and PL2 may have fixed magnetization directions. Here, the magnetization direction of the first pinned layer PL1 may be opposite or anti-parallel to the magnetization direction of the second pinned layer PL2. The free layer FL may have a magnetization direction changeable to be parallel or anti-parallel to the fixed magnetization directions of the first and second pinned layers PL1 and PL2. The magnetization directions of the free layer FL and the first and second pinned layers PL1 and PL2 may be substantially parallel or perpendicular to top surfaces of the first and second tunnel barrier layers TBL1 and TBL2.

The data storage pattern DSP may further include a bottom electrode BE and a top electrode TE that may be formed of a conductive metal nitride. The first pinned layer PL1, the first tunnel barrier layer TBL1, the free layer FL, the second tunnel barrier layer TBL2, and the second pinned layer PL2 may be sequentially stacked between the bottom electrode BE and the top electrode TE.

The semiconductor memory devices described in the aforementioned embodiments may be encapsulated using various packaging techniques. For example, the semiconductor memory devices according to some of the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and/or a wafer-level processed stack package (WSP) technique.

Figure 20:
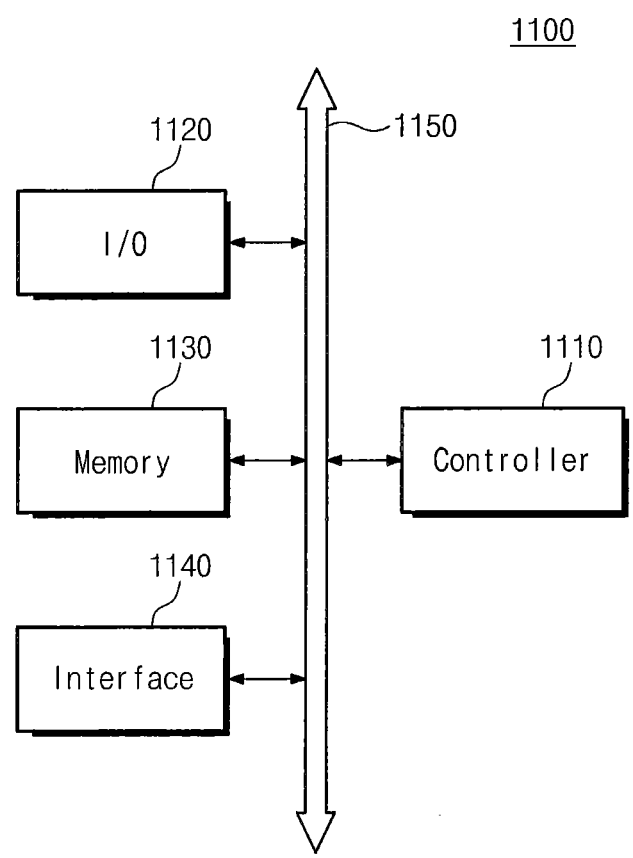
FIG. 20 is a schematic block diagram illustrating an electronic system including a semiconductor memory device according to embodiments of the inventive concepts.

FIG. 20 is a schematic block diagram illustrating an electronic system including a semiconductor memory device according to some embodiments of the inventive concepts. Referring to FIG. 20, an electronic system 1100 according to some embodiments of the inventive concept may include a controller 1110, an input/output (I/O) unit 1120, a memory device 1130, an interface unit 1140, and a data bus 1150. At least two of the controller 1110, the 110 unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 114 may include the semiconductor memory devices according to the aforementioned embodiments of the inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna and/or a wireless/cable transceiver. Although not shown in the drawings, the electronic system 1100 may further include a fast dynamic random access memory (DRAM) device and/or a fast static random access memory (SRAM) device which acts as a working memory device for improving an operation of the controller 1110.

The electronic system 1100 may be applied to a personal digital assistant (PDA), a portable computer, a web tablet, a wireless phone, a mobile phone, a digital music player, a memory card and/or other electronic products. The other electronic products may receive and/or transmit information data by wireless.

Figure 21:
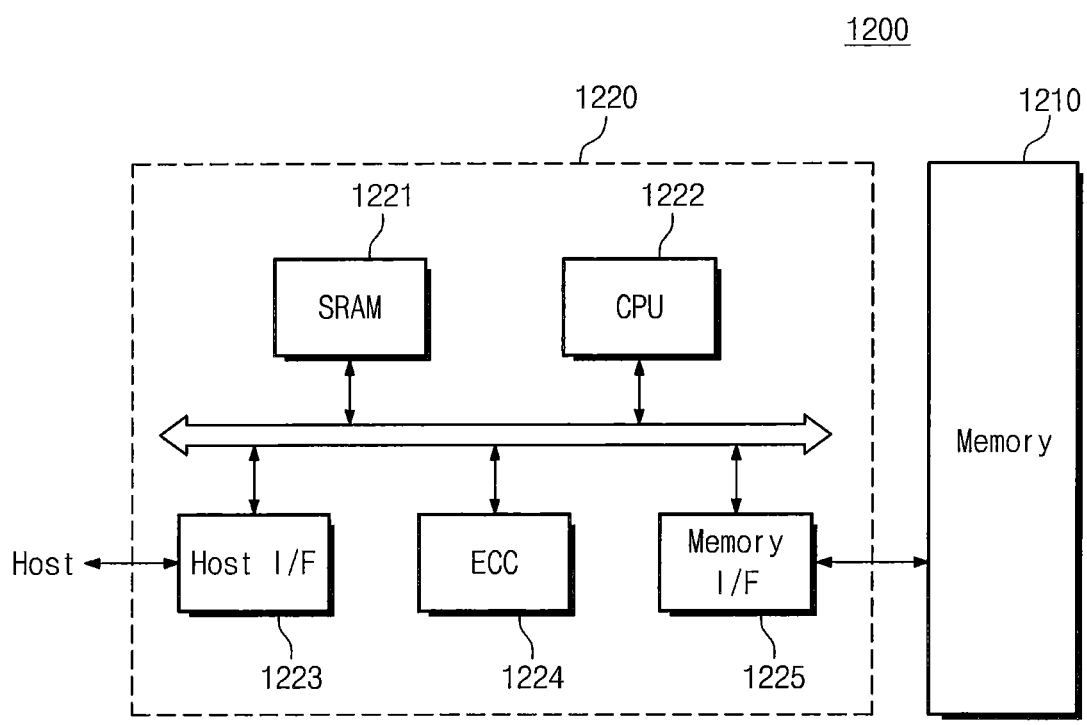
FIG. 21 is a schematic block diagram illustrating a memory card including a semiconductor memory device according to embodiments of the inventive concepts.

FIG. 21 is a schematic block diagram illustrating a memory card including a semiconductor memory device according to some embodiments of the inventive concepts. Referring to FIG. 21, a memory card 1200 includes a memory device 1210. The memory device 1210 may include at least one of the semiconductor memory devices according to embodiments mentioned above. In addition, the memory device 1210 may further include another type of semiconductor memory devices which are different from the semiconductor memory devices according to embodiments described above. For example, the memory device 1210 may further include a DRAM device and/or a SRAM device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

Figure 22:
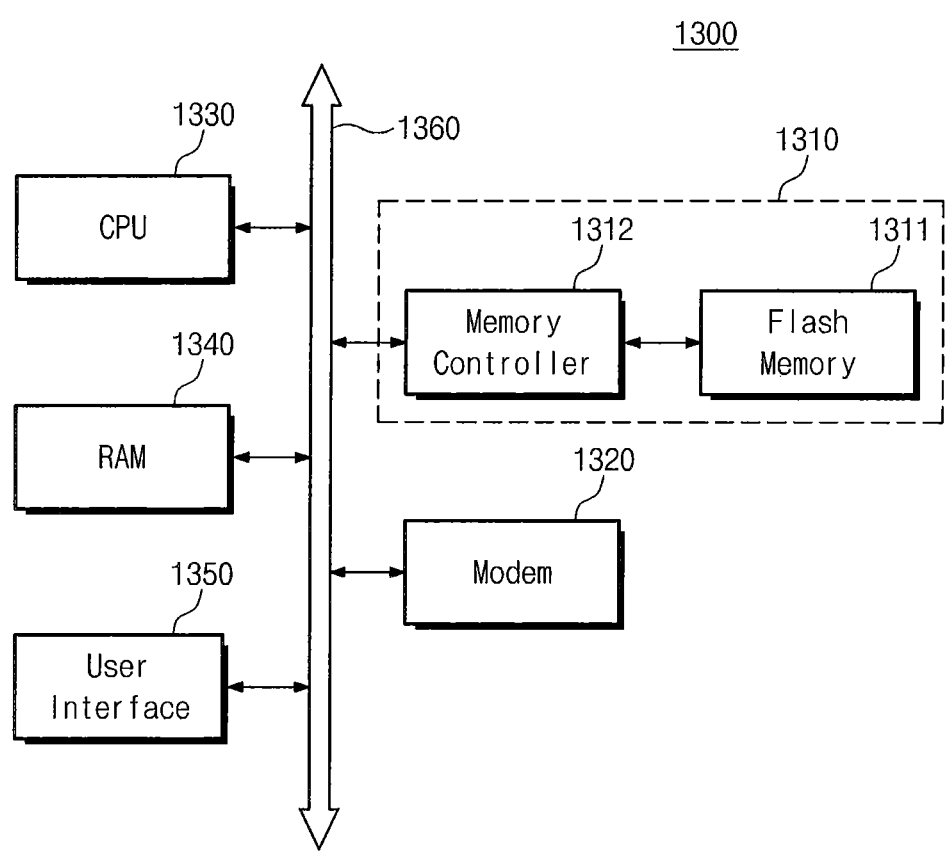
FIG. 22 is a schematic block diagram illustrating an information processing system including a semiconductor memory device according to embodiments of the inventive concepts.

FIG. 22 is a schematic block diagram illustrating an information processing system including a semiconductor memory device according to some embodiments of the inventive concepts.

Referring to FIG. 22, a memory system 1310 may be implemented with at least one of the semiconductor memory devices according to some of the aforementioned embodiments. The memory system 1310 may be installed in an information processing system 1300 such as a mobile device or a desk top computer. The information processing system 1300 according to some embodiments of the inventive concepts may include a modem 1320, a central processing unit (CPU) 1330, a random access memory (RAM) 1340, and a user interface unit 1350 that are electrically connected to a memory system 1310 through a system bus 1360. The memory system 1310 may have substantially the same structure as the memory card 1200 described with reference to FIG. 21. In other words, the memory system 1310 may include a memory device 1311 and a memory controller 1312 controlling overall operations of the memory device 1311. The memory system 1310 may store data processed by the CPU 1330 and/or data inputted from an external system. In some embodiments, the memory system 1310 may be realized as a solid state disk (SSD). In this case, the information processing system 1300 may stably store massive data into the memory system 1310, In addition, as reliability of the memory system 1310 increases, the memory system 1310 may reduce a resource consumed for correcting errors. Even though not shown in the drawings, the information processing system 1300 may further include an application chipset, a camera image processor (CIS), and/or an input/output unit.

In the semiconductor memory device according to some embodiments of the inventive concepts, the unit memory cell includes the first and second memory elements, and data opposite to each other may be written in the first and second memory elements at the same time. Thus, since one of the first and second memory elements is used as the reference resistance when data is read from the unit memory cell, the sensing margin of the semiconductor memory device may be improved. In addition, it is possible to improve the integration density of the semiconductor memory device having the unit memory cells of which each includes the first and second memory elements.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device comprising:
   a first bit line that is at a first height from a semiconductor substrate;
   a second bit line that is at a second height from the semiconductor substrate, the second height different from the first height;
   a first variable resistance memory element that is connected to the first bit line and that is at a third height from the semiconductor substrate; and
   a second variable resistance memory element that is connected to the second bit line and that is substantially at the third height.

2. The semiconductor memory device of claim 1, wherein the third height of the first and second variable resistance memory elements is between the first height of the first bit line and the second height of the second bit line in a vertical view.

3. The semiconductor memory device of claim 1, wherein the first and second bit lines extend in parallel along a first direction when viewed from a plan view.

4. The semiconductor memory device of claim 3, wherein the first variable resistance memory element is at a position that is shifted from the second variable resistance memory element in a diagonal direction with respect to the first direction, when viewed from a plan view.

5. The semiconductor memory device of claim 1, wherein ones of the first and second variable resistance memory elements comprise:
   a pinned magnetic layer;
   a free magnetic layer; and
   a tunnel barrier layer that is between the pinned magnetic layer and the free magnetic layer,
   wherein the free magnetic layer of the first variable resistance memory element is adjacent the first bit line, and
   wherein the pinned magnetic layer of the second variable resistance memory element is adjacent the second bit line.

6. The semiconductor memory device of claim 1, further comprising:
   a selection transistor that is connected in common to the first and second variable resistance memory elements.

7. The semiconductor memory device of claim 1, further comprising:
   a device isolation layer that defines an active portion in the semiconductor substrate;
   a word line that intersects the active portion;
   first and second dopant regions in the active portion at both sides of the word line;
   a source line that is connected to the first dopant region; and
   a conductive pattern that is substantially at the second height of the second bit line and electrically connected to the second dopant region,
   wherein the conductive pattern is electrically connected in common to the first and second variable resistance memory elements.

8. The semiconductor memory device of claim 7, further comprising:
   an interconnection pattern that is substantially at the first height as the first bit line,
   wherein the interconnection pattern electrically connects the conductive pattern to the second variable resistance memory element.

9. The semiconductor memory device of claim 7, wherein ones of the first and second variable resistance memory elements comprise:
   a pinned magnetic layer;
   a free magnetic layer; and
   a tunnel barrier layer that is between the pinned magnetic layer and the free magnetic layer,
   wherein the pinned magnetic layer of the first variable resistance memory element is on a top surface of the conductive pattern, and
   wherein the pinned magnetic layer of the second variable resistance memory element is on a top surface of the second bit line.

10. The semiconductor memory device of claim 1, further comprising:
    a source line;
    a first selection transistor that is connected between the source line and the first variable resistance memory element; and
    a second selection transistor that is connected between the source line and the second variable resistance memory element.

11. The semiconductor memory device of claim 1, further comprising:
    a device isolation layer that defines first and second active portions in the semiconductor substrate;
    a word line that intersects the first and second active portions;
    first and second dopant regions in each of the first and second active portions at both sides of the word line;
    a source line that is connected in common to the first dopant regions of the first and second active portions;
    a conductive pattern that is substantially at the second height of the second bit line and electrically connected to the second dopant region of the first active portion; and
    an interconnection pattern that is substantially at the first height of the first bit line and that electrically connects the conductive pattern to the second variable resistance memory element.

12. The semiconductor memory device of claim 11, wherein the second variable resistance memory element comprises:
- a pinned magnetic layer;
- a free magnetic layer; and
- a tunnel barrier layer between the pinned magnetic layer and the free magnetic layer, and
- wherein the pinned magnetic layer of the second variable resistance memory element is on a top surface of the second bit line.

13. The semiconductor memory device of claim 11, wherein the first variable resistance memory element is electrically connected to the second dopant region of the second active portion.

14. The semiconductor memory device of claim 11, wherein the first variable resistance memory element comprises:
- a pinned magnetic layer;
- a free magnetic layer; and
- a tunnel barrier layer between the pinned magnetic layer and the free magnetic layer,
- wherein the free magnetic layer of the first variable resistance memory element is adjacent a bottom surface of the first bit line.

15. A semiconductor memory device comprising:
- a source line;
- a first bit line and a second bit line that each extend in parallel along one direction on the source line;
- a first variable resistance memory element that is connected between the source line and the first bit line; and
- a second variable resistance memory element that is connected between the source line and the second bit line,
- wherein ones of the first and second variable resistance memory elements comprise:
  - a pinned magnetic layer;
  - a free magnetic layer; and
  - a tunnel barrier layer between the pinned and free magnetic layers,
- wherein the free magnetic layer of the first variable resistance memory element is adjacent the first bit line, and
- wherein the pinned magnetic layer of the second variable resistance memory element is adjacent the second bit line.

16. The semiconductor memory device of claim 15, wherein the first bit line and the second bit line are at different heights from a top surface of a semiconductor substrate, and
- wherein the first and second variable resistance memory elements are at substantially a same height from the top surface of the semiconductor substrate.

17. A semiconductor memory device comprising:
- first and second bit lines that extend in parallel to each other and are spaced apart in a first direction;
- a source line that is at a different height from a top surface of a semiconductor substrate than the first bit line and that is at a different height from the top surface of the semiconductor substrate than the second bit line;
- a first variable resistance memory element that is connected to the first bit line and to the source line and that comprises:
  - a first pinned magnetic layer;
  - a first free magnetic layer; and
  - a first tunnel barrier layer between the first pinned magnetic layer and the first free magnetic layer; and
- a second variable resistance memory element that is connected to the second bit line and to the source line and that comprises:
  - a second pinned magnetic layer;
  - a second free magnetic layer; and
  - a second tunnel barrier layer between the second pinned magnetic layer and the second free magnetic layer.

18. The semiconductor memory device according to claim 17, wherein the first bit line and the second bit line are at different heights from the top surface of a semiconductor substrate, and
- wherein the first and second variable resistance memory elements are at substantially a same height from the top surface of the semiconductor substrate.

19. The semiconductor memory device according to claim 17,
- wherein the first free magnetic layer of the first variable resistance memory element is adjacent a bottom surface of the first bit line, and
- wherein the second pinned magnetic layer of the second variable resistance memory element is adjacent a bottom surface of the second bit line.

* * * * *